United States Patent
Raynor et al.

(10) Patent No.: US 10,670,456 B2
(45) Date of Patent: Jun. 2, 2020

(54) ZERO POWER SENSORS

(71) Applicant: STMicroelectronics (Research & Development) Limited, Buckinghamshire (GB)

(72) Inventors: Jeffrey M. Raynor, Edinburgh (GB); Laurence Stark, Edinburgh (GB); Filip Kaklin, Edinburgh (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 212 days.

(21) Appl. No.: 15/692,340

(22) Filed: Aug. 31, 2017

(65) Prior Publication Data
US 2018/0195897 A1   Jul. 12, 2018

(30) Foreign Application Priority Data
Jan. 10, 2017   (EP) .................................. 17150885

(51) Int. Cl.
| G01J 1/42 | (2006.01) |
| H01L 31/042 | (2014.01) |
| G01J 1/46 | (2006.01) |
| G01J 1/44 | (2006.01) |
| H01L 31/02 | (2006.01) |

(52) U.S. Cl.
CPC .............. G01J 1/4204 (2013.01); G01J 1/44 (2013.01); G01J 1/46 (2013.01); H01L 31/02021 (2013.01); H01L 31/042 (2013.01); G01J 2001/446 (2013.01); Y02E 10/50 (2013.01)

(58) Field of Classification Search
CPC .... G01J 1/4204; G01J 1/44; G01J 1/46; G01J 2001/446; H02J 1/06; H01L 31/02021; H01L 31/042; Y02E 10/50
See application file for complete search history.

(56) References Cited

U.S. PATENT DOCUMENTS

| 3,757,511 A | * | 9/1973 | Burgess ................. G04C 10/02 257/E27.128 |
| 4,325,146 A | * | 4/1982 | Lennington ............. G01S 17/74 340/10.33 |
| 4,963,764 A | * | 10/1990 | Quan ....................... H03F 1/26 323/315 |

(Continued)

FOREIGN PATENT DOCUMENTS

| JP | 2012169379 A | 9/2012 |
| JP | 2012204262 A | * 10/2012 |

(Continued)

OTHER PUBLICATIONS

Kadirvel, Karthik, et al., "Self-Powered, Ambient Light Sensor Using bq25504", Texas Instruments Application Report, SLUA629A, Sep. 2013, XP055391955, pp. 1-4.

Primary Examiner — Que Tan Le
Assistant Examiner — Jennifer D Bennett
(74) Attorney, Agent, or Firm — Slater Matsil, LLP

(57) ABSTRACT

An integrated circuit includes a substrate and at least one photo-voltaic cell implemented on the substrate. The at least one photo-voltaic cell is configured to generate a supply voltage. Circuitry is implemented on the substrate. The circuitry is powered by the supply voltage. The at least one photo-voltaic cell can include a number of series-connected photo-voltaic cells.

19 Claims, 24 Drawing Sheets

(56) References Cited

U.S. PATENT DOCUMENTS

| | | | |
|---|---|---|---|
| 6,175,075 B1* | 1/2001 | Shiotsuka | B32B 17/04 |
| | | | 136/244 |
| 7,615,396 B1* | 11/2009 | Lee | H01L 21/761 |
| | | | 257/461 |
| 8,697,986 B2* | 4/2014 | Huang | H01L 31/022441 |
| | | | 136/255 |
| 2003/0155484 A1 | 8/2003 | Wiles, Jr. | |
| 2004/0098067 A1* | 5/2004 | Ohta | A61F 9/08 |
| | | | 607/54 |
| 2007/0085514 A1* | 4/2007 | Utsunomiya | H02M 3/1588 |
| | | | 323/222 |
| 2012/0085385 A1 | 4/2012 | Keysar et al. | |

FOREIGN PATENT DOCUMENTS

| | | |
|---|---|---|
| WO | 2009012346 A1 | 1/2009 |
| WO | 2013179898 A1 | 12/2013 |

\* cited by examiner

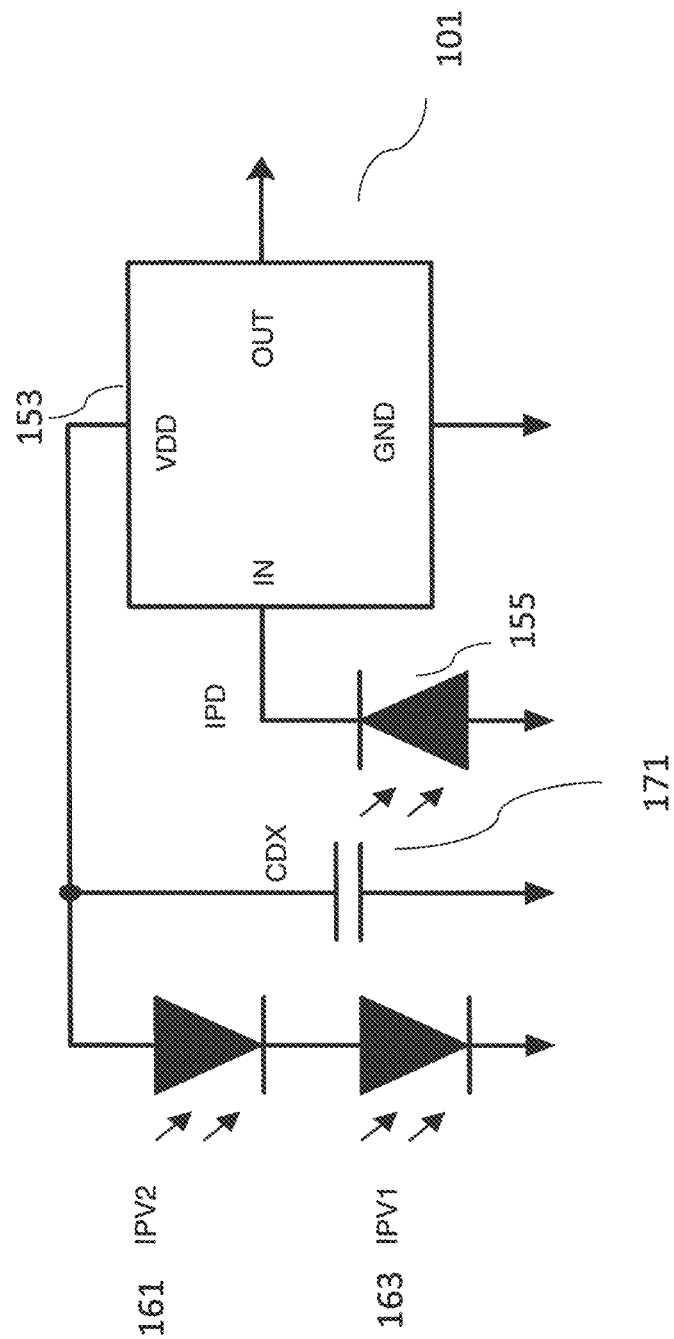

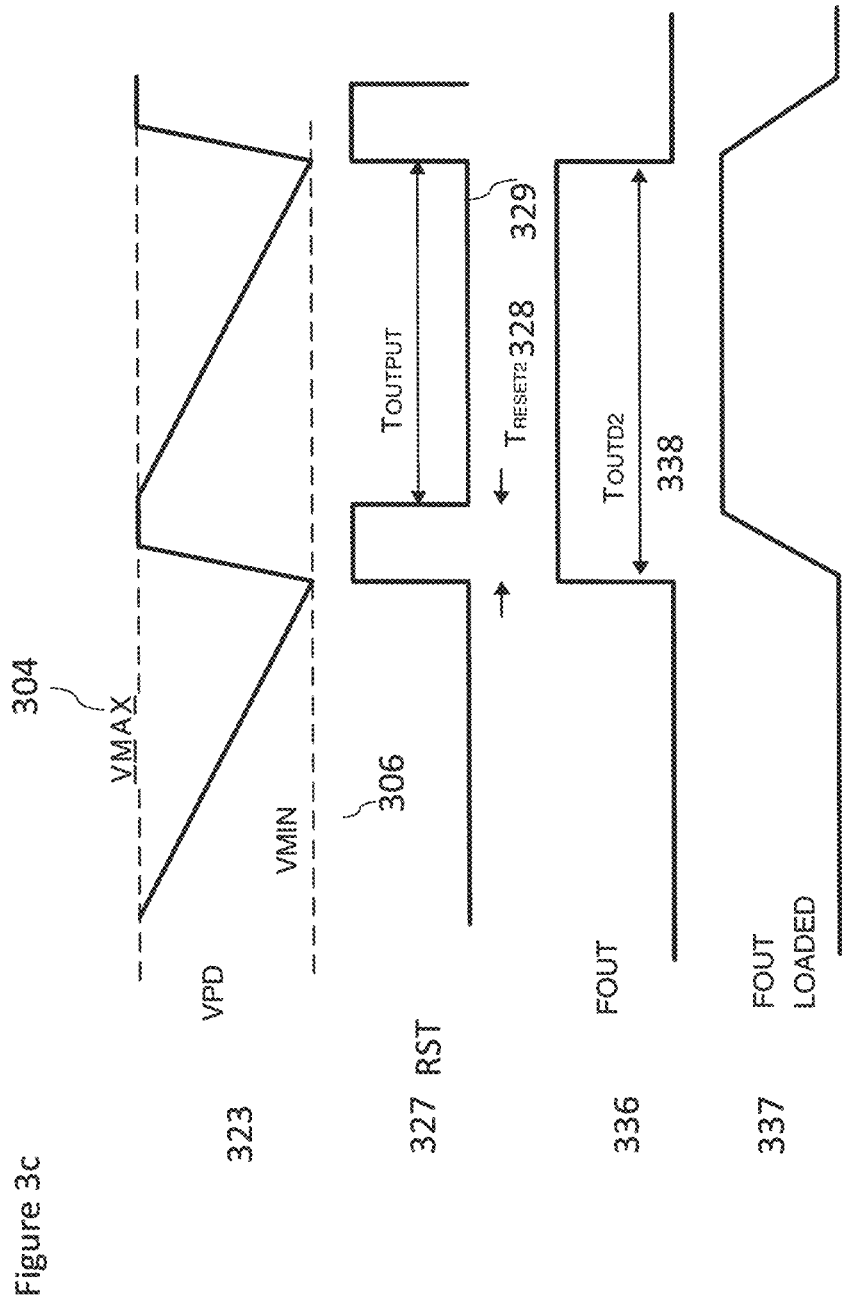

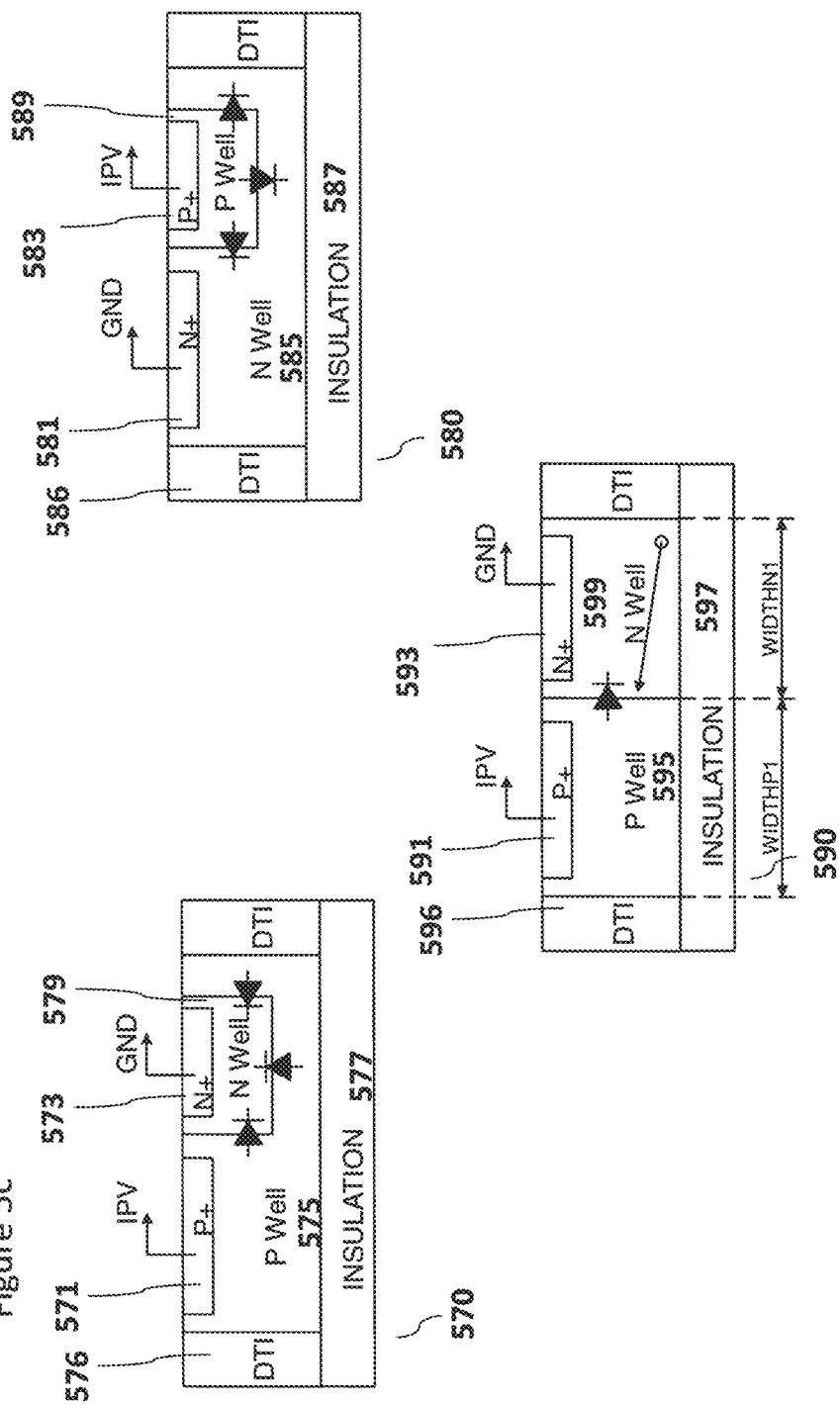

ZERO POWER SENSORS

CROSS-REFERENCE TO RELATED APPLICATIONS

This application claims priority to European Patent Application No. 17150885.6, filed on Jan. 10, 2017, which application is hereby incorporated herein by reference.

TECHNICAL FIELD

Some embodiments relate to an apparatus and in particular but not exclusively to zero power sensors.

BACKGROUND

Devices and sensors for determining ambient light are known. For example, such sensors may be used in many applications such as within devices with a display where the sensor is configured to sense the ambient light levels and thus control the display light levels so that they are not too bright or too dim for the user to view the display and furthermore to optimize power consumption. Typical ambient light sensors require an external power supply. In other words in order to generate a usable output voltage/current value level the sensor is required to be coupled to a power supply, such as a battery or dc power line (for example, a USB connection supplying power to the sensor).

These ambient light sensors furthermore consume power even in standby and thus are not acceptable where power consumption is important (or critical) such as in small devices, for example, 'internet-of-things' sensor packs and wearables. Furthermore such sensors are not acceptable for devices where providing power or maintaining power supplies are difficult, for example, devices operating in hazardous environments.

SUMMARY

Some embodiments relate to an apparatus and in particular but not exclusively to an apparatus with a photosensitive device for providing ambient light readings without requiring an external source of power.

Embodiments provide the functionality of ambient light sensing but without the requirement for supplying or providing the sensor with power in order for it to provide the suitable output.

According to an aspect, an integrated circuit comprises a substrate and at least one photo-voltaic cell implemented on the substrate. The at least one photo-voltaic cell is configured to generate a supply voltage. Circuitry is implemented on the substrate and is powered by the supply voltage.

Each of the at least one photo-voltaic cells may be isolated from the substrate.

Each of the at least one photo-voltaic cell may be isolated from the substrate by implementing the cell within a deep trench isolation ring on an insulation layer implemented on the substrate.

Each of the at least one photo-voltaic cell may be isolated from the substrate by implementing a N well cell within a P well ring and over a PISO insulation layer implemented on a N-EPI or N-Bulk substrate.

Each of the at least one photo-voltaic cell may be isolated from the substrate by implementing a P well cell within a N well ring and over a NISO insulation layer implemented on a P-EPI or P-Bulk substrate.

The at least one photo-voltaic cell configured to generate the supply voltage may comprise a plurality of photo-voltaic cells coupled in series to generate the supply voltage.

An area ratio of the plurality of photo-voltaic cells coupled in series to generate the supply voltage may be $1:1/k^n$, where k is an area ratio factor substantially between 1.1 to 2, and n is a number of the photo-voltaic cells in the coupled series of photo-voltaic cells.

The plurality of photo-voltaic cells coupled in series may be further configured to generate at least one further supply voltage, the at least one further supply voltage being less than the supply voltage.

The circuitry implemented on the substrate may be an ambient light sensor comprising a light to frequency oscillator comprising a photodiode coupled via a switch to the supply voltage, the switch configured to reset the photodiode and controlled by a photodiode output.

The ambient light sensor may further comprise an inverter wherein an inverter input is coupled to the photodiode output and an inverter output is coupled to the switch to control the reset of the photodiode.

The inverter may be powered by the further supply voltage

The integrated circuit may further comprise a further supply voltage smoothing capacitor coupled between the further supply voltage and a ground voltage.

The integrated circuit may further comprise at least one frequency divider coupled to the output of the inverter.

The inverter may comprise an odd number of inverters connected in series further wherein an input for the first inverter of the odd number of inverters is coupled to the photodiode output and an output for the last inverter of the odd number of inverters is coupled to the switch to control the reset of the photodiode.

The integrated circuit may further comprise a supply voltage smoothing capacitor coupled between the supply voltage and a ground voltage.

According to a second aspect, there is provided a method for providing an integrated circuit comprising a substrate, the integrated circuit comprising: at least one photo-voltaic cell implemented on the substrate, the at least one photo-voltaic cell generating a supply voltage and powering and further circuitry implemented on the substrate.

The method may comprise isolating each of the at least one photo-voltaic cells from the substrate.

The method may comprise isolating each of the at least one photo-voltaic cell from the substrate by implementing the cell within a deep trench isolation ring on an insulation layer on the substrate.

The method may comprise isolating each of the at least one photo-voltaic cell from the substrate by implementing a N well cell within a P well ring and over a PISO insulation layer implemented on a N-EPI or N-Bulk substrate.

Each of the at least one photo-voltaic cell may be isolated from the substrate by implementing the P well cell within a N well ring and over a NISO insulation layer implemented on the P-EPI or P-Bulk substrate.

The at least one photo-voltaic cell generating the supply voltage may comprise coupling a plurality of photo-voltaic cells in series to generate the supply voltage.

The method may comprise determining an area ratio, of the plurality of photo-voltaic cells coupled in series to generate the supply voltage, as $1:1/k^n$, where k is an area ratio factor substantially between 1.1 to 2, and n is a number of the photo-voltaic cells in the coupled series of photo-voltaic cells.

The method may comprise generating at least one further supply voltages, the at least one further supply voltage being less than the supply voltage.

The circuitry implemented on the substrate may be an ambient light sensor, the method further comprising providing a light to frequency oscillator comprising a photodiode coupled via a switch to the supply voltage, the switch configured to reset the photodiode and controlled by a photodiode output.

The ambient light sensor may further comprise an inverter wherein an inverter input is coupled to the photodiode output and an inverter output is coupled to the switch to control the reset of the photodiode.

The inverter may be powered by the at least one further supply voltage

The method may further comprise a providing further supply voltage smoothing capacitor coupled between the at least one further supply voltage and a ground voltage.

The method may further comprise providing at least one frequency divider coupled to the output of the inverter.

The inverter may comprise an odd number of inverters connected in series further wherein an input for the first inverter of the odd number of inverters is coupled to the photodiode output and an output for the last inverter of the odd number of inverters is coupled to the switch to control the reset of the photodiode.

The method may further comprise providing a supply voltage smoothing capacitor coupled between the supply voltage and a ground voltage.

BRIEF DESCRIPTION OF THE DRAWINGS

An integrated circuit may comprise the ranging apparatus as discussed previously.

Some embodiments will now be described by way of example only and with reference to the accompanying Figures in which:

FIG. 1b shows schematically an example ambient light sensor and modelled current sources shown in FIG. 1a;

FIG. 1d shows schematically an example ambient light sensor as shown in FIG. 1a, the light sensor configured with multiple PV cells and power decoupling capacitor;

FIG. 3a shows a high and low light oscillation waveform generated by the ambient light sensor shown in FIG. 2a;

FIG. 3c shows an example pulse lengthened oscillation waveform generated by the ambient light sensor shown in FIG. 2f;

FIG. 5c shows schematically example single PV cell deep well isolation process voltage/power generator configurations according to some embodiments;

DETAILED DESCRIPTION OF ILLUSTRATIVE EMBODIMENTS

The concept as discussed above is the provision of a practical ambient light sensor which does not require any external power or voltage source to function. The concept is embodied by the implementation of a photovoltaic (PV) power/voltage generator which powers an oscillator comprising a photodiode in order to generate a signal output where the frequency is dependent on the ambient light level.

Figure 1A:
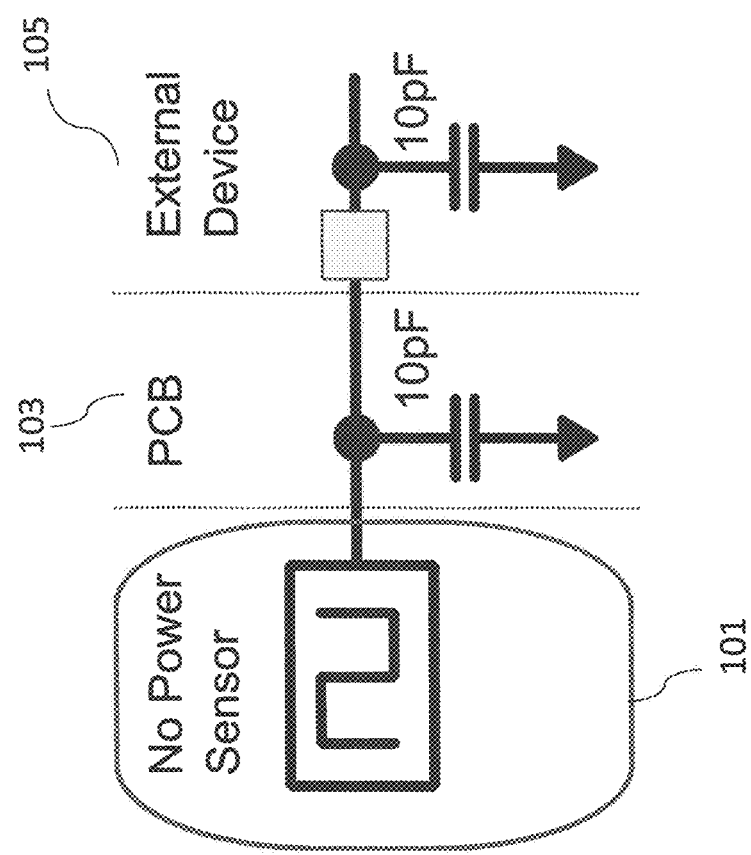
FIG. 1a shows schematically an example ambient light sensor according to some embodiments.

FIG. 1a, for example, shows a schematic overview of a 'no-power' ambient light sensor and example loads which the sensor drives in order to function. The ambient light sensor 101 implemented within a suitable package with output pins will typically be mounted on a printed circuit board (PCB) 103 and which will then output the signal to an external device 105. The printed circuit board 103 typically has capacitance load in the order of 10 pF. Similarly the stray capacitive load of the external device is typically of the order of 10 pF. In other words the sensor 101 has to service an off chip load of the order of 20 pF. This load may be significant compared to the power consumption of the on-chip ambient light sensor 101.

For example, the 'off-chip load' of 20 pF means that for a 1 MHz signal with a 2V swing and a 1oons rise time the current required to be generated by the device is defined by $I=C\times\delta V/\delta t$ which means a peak current in the order of 400 µA and an average current of 40 µA.

In the following examples the 'no-power' ambient light sensor power/voltage generator is formed from a series coupled PV cell arrangement. A PV device is a diode which is forward biased and where implemented in a stand alone configuration typically both terminals are floating terminals such that they may be stacked to provide a higher voltage output. Where PV diodes are integrated onto the same silicon, typically one terminal of each of the PV diodes are in common. This may be compared with the photodiode (PD) arrangement wherein the diode is reverse biased and the anodes are arranged in common (as the ground).

The PN junction within the PV and PD diode configurations are formed from two sections of doped silicon, a N-type with an excess of electrons or negative charge carriers and a P-type with an excess of holes or positive charge carriers, placed in contact with each other. The electrons and holes diffuse to create a depletion region and an electric (E) field. Any photon impacts (on intrinsic silicon) within the depletion region may generate electron-hole pairs which generate charge and voltage. Where there is a significant number of photons then the more electron-hole pairs are generated which cause the depletion region to shrink and disappear. When a circuit is formed between the anode and cathode then the photo-generated charge can flow and a current is generated in the circuit.

The photovoltaic device is typically modelled as an ideal current source, in other words a device which when in in open circuit (with no load) generates a voltage $V_{pv}=V_{oc}$ and a current $I_{pv}=0$ and when in short circuit generates a voltage $V_{pv}=0$ and a current $I_{pv}=I_{sc}$. The short circuit current is dependent on the light level such that the more light is received, the more current is generated. However practical photovoltaic devices are further modelled by an output resistance $R_{out}$ in series with the load and models a decrease in the output voltage as more current is output by the device and a shunt resistance and a shunt resistance $R_{shunt}$ in parallel with the load and models a decrease in the current through the load as the voltage increases.

The combination of the output resistance and shunt resistance produces a IV curve output which deviates from the ideal current mirror performance such that the max power output by the photovoltaic device occurs when it outputs voltage $V_{pv}=V_{mp}<V_{oc}$ and a current $I_{pv}=I_{sc}<I_{sc}$.

For crystalline Silicon PV cells the $V_{oc}$ is 0.7V or less. Unfortunately 0.7V is too low for powering most circuits. Fortunately it is possible to connect PV cells in series to generate multiples of the cell voltage. Thus, for example, connecting three cells in series may produce a voltage of 2.1V (3×0.7V). However this now requires three times the area and both terminals need to be floating (in other words not connected to ground). Furthermore the current generated at 0.7V for a PV cell is dependent on both the cell size and the light levels. For example, a 1 mm×1 mm cell in office light (approx. 100 Lux) may generate a current in the order of 125 nA, in summer UK outdoor light (approx. 1 kLux) may generate a current in the order of 1.3 µA, and in equatorial Singapore outdoor light (approx. 100 kLux) may generate a current in the order of 125 µA. A sensor which can be powered by such low current levels in the order of 100 nA means that many standard electronic designs cannot be used.

As indicated above the small current and the power consumption of off-chip elements requires the sensor to be configured such that a decoupling capacitor is employed to smooth out peak current consumption, such that the output is a relatively slow output which becomes slower at lower light levels, very slow at very low light levels and very very slow at very very lower light levels.

Figure 1B:
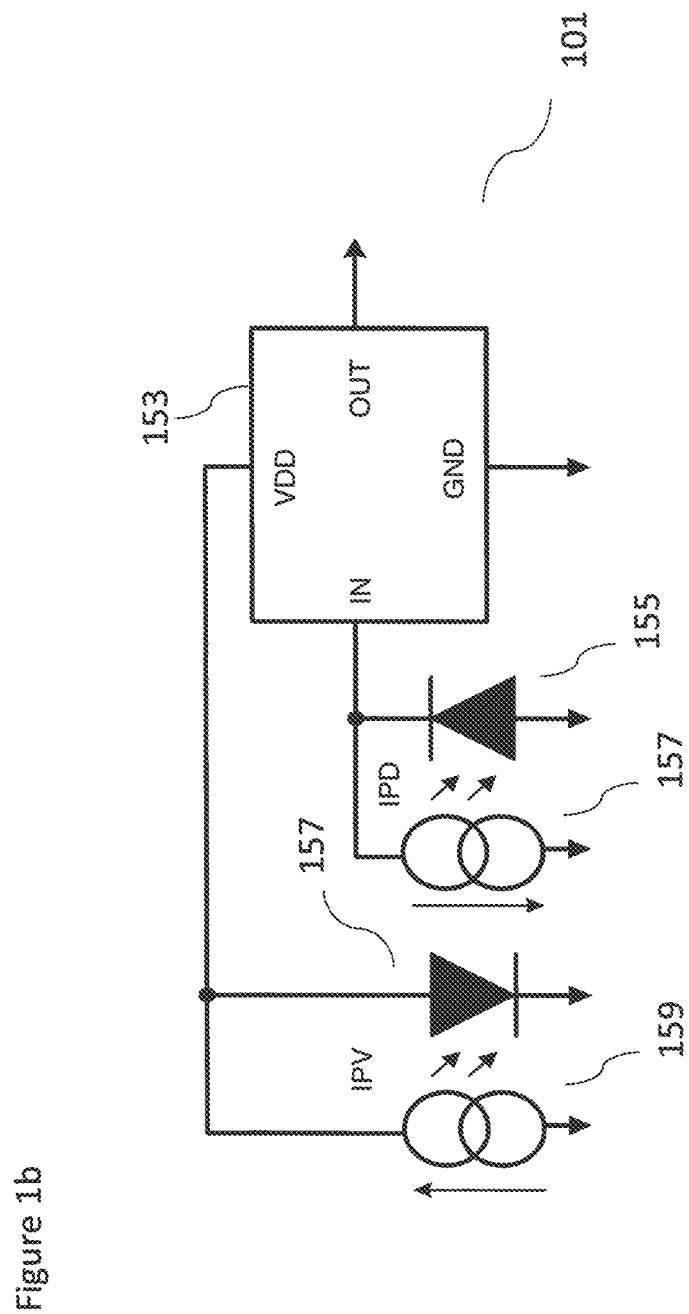

The concept such as shown in FIG. 1b is to employ an ambient light sensor 101, and specifically a light-to-frequency ambient light sensor. Light-to-frequency sensors in such embodiments have the advantage that power consumption reduces in low light levels. Thus where there is more light there is more power available and more power consumed and where there is less light there is less power available but less power consumed.

FIG. 1b shows a photovoltaic (PV) cell 157 (and associated modelled current source 159) which is configured to power ambient light sensor (ALS) circuitry 153. The diode in the photovoltaic cell 157 is operated in forward bias mode and the current (as modelled by the current source 159) produced is used to power the ALS circuitry 153.

The sensor may further comprise a photodiode 155 (with modelled current sink 157) which may be configured to generate a signal (and which may be modelled as a charge, voltage or current signal) which is input to the ALS circuitry 153.

The sensor further comprises ALS circuitry 153, which is powered by the PV cell 157 and receives the photodiode 155 signal. The ALS circuitry may be configured to convert the photodiode 155 signal and produce an output. The output may be in the form of either a voltage, a current or a digital signal (where the level of impinging light is converted into a digital representation of this light level).

As the PV diode is operated in forward bias mode while the photodiode is operated in reverse bias mode, at least part of the current produced by the photovoltaic cell is consumed by the photodiode. This is disadvantageous as then there is less current available for the ALS measurement circuitry.

A solution to this issue is to reduce the photocurrent. A first implementation method to achieve this is to design the photodiode to have a much smaller area than the diode used in the photovoltaic cell. Other embodiments may attempt to reduce this issue by implementing a light-blocking layer on the photodiode, or by implementing a photodiode with reduced Quantum efficiency.

Reducing the size of the photodiode produces a smaller signal and furthermore degrades the sensors signal-noise ratio. In some embodiments a typical ratio of sizes (areas) of diodes is 10:1. In other words where PDX and PDY are the physical dimensions of the sides of the photodiode and PVX and PVY are the physical dimensions of the sides of the photovoltaic cell then the relationship between PDX, PDY, PVX, and PVY may be $$PDX*PDY*10=PVY*PVX \qquad (\text{Eqn.1})$$

Figure 1C:
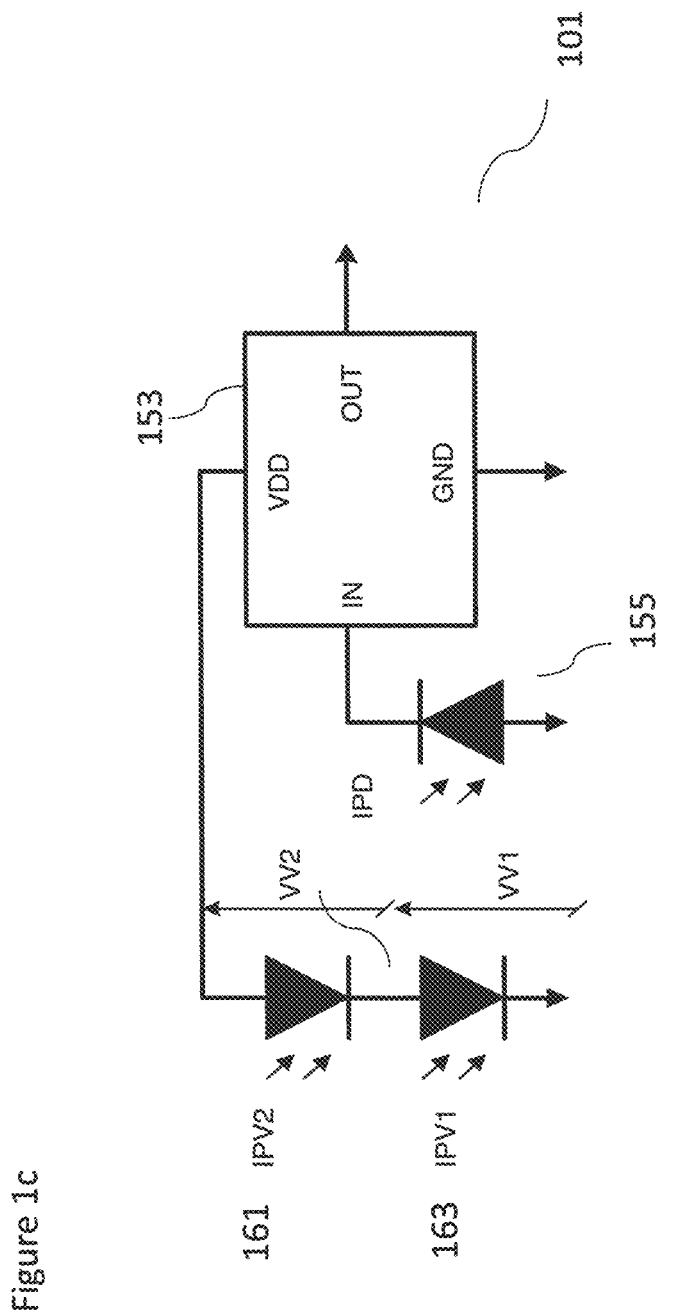
FIG. 1c shows schematically an example ambient light sensor as shown in FIG. 1a, the light sensor configured with multiple PV cells.

FIG. 1c shows a further example sensor. In this sensor the ALS circuitry 153 is powered by a series combination of PV cells. Thus FIG. 1c shows a first photovoltaic (PV) cell 163 (and generated voltage $VV_1$) and a second photovoltaic (PV) cell 161 (and generated voltage $VV_2$). Thus the ALS circuitry 153 in this example is powered by the combined voltage of $VV_1+VV_2$. In general where there are 1 to N stacked or series combination pv cells which generate voltages $VV_1$ to $VVN$ then the combined voltage is $VV_1+VV_2+\ldots+VVN$.

FIG. 1d shows another example sensor. In this sensor the ALS circuitry 153 is powered by a series combination of PV cells and furthermore comprises a decoupling capacitor CDX 171 which is connected in parallel with the series combination of the first photovoltaic (PV) cell 163 and the second photovoltaic (PV) cell 161. The current consumption of the ALS circuitry described later in further detail is not constant. For example, when the logic elements change values or photo-diodes are reset, more current is consumed. In some situations, the instantaneous current consumption is greater than the amount of current that the photovoltaic cell can provide. Hence, it is desirable to smooth or average out the current consumption and/or store some energy in a capacitor. This can be achieved by incorporating at least one decoupling capacitor such as shown in FIG. 1d. The decoupling capacitor CDX in some embodiments is implemented as a metal-insulator-metal ("MIM"), metal-oxide-metal ("MOM") or gate oxide ("ThinOX") for higher capacitance density.

Thus it is possible to design a sensor where the power consumed<power available.

Figure 2A:
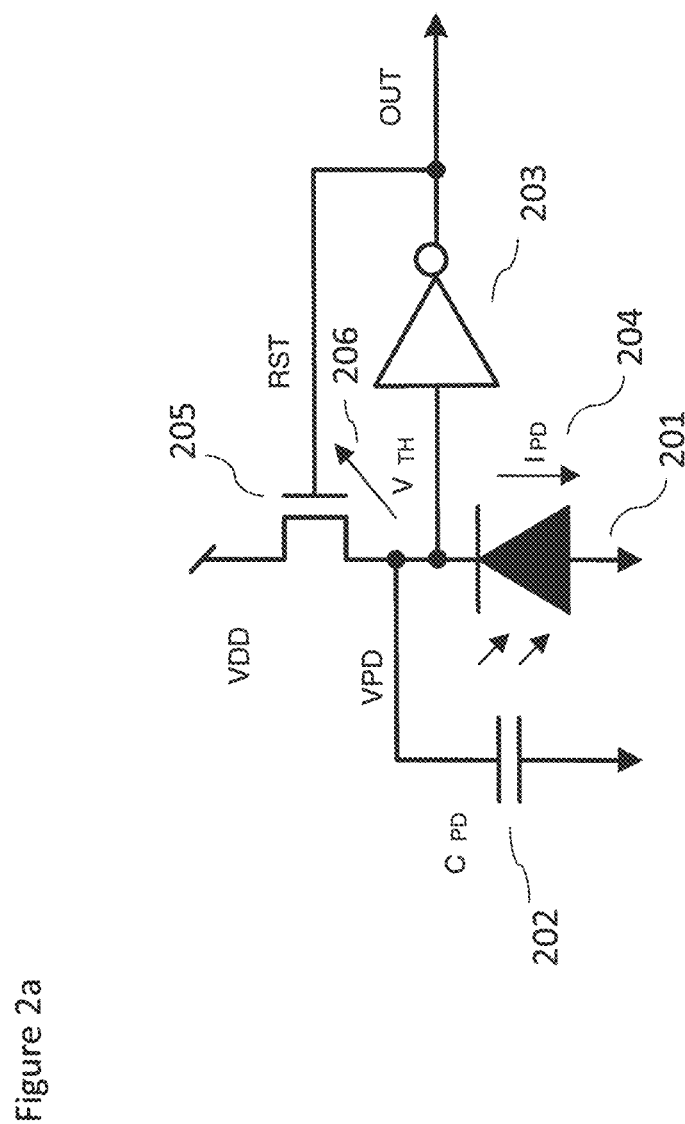
FIG. 2a shows schematically the example ambient light sensor as shown in FIGS. 1a to 1d in further detail.

FIG. 2a shows a simplified circuit implementation which shows a first example of the ALS circuitry operating a 'light' signal to frequency converter. In this example the photodiode 201 generates a light dependent current (or current sink) $I_{PD}$ 204 and the photodiode capacitance (modelled as capacitor 202) produces a voltage $V_{PD}$ which is passed to an inverter 203. The output of the inverter 203 (with an associated delay) produces a pulse which operates as a reset input to a transistor 205 coupled between the photodiode 201 and a supply voltage $V_{dd}$ (produced by the PV power/voltage generator described hereafter). Thus then the output of the inverter pulses the transistor the transistor resets the $V_{pd}$ to close to $V_{dd}$ (Not quite $V_{dd}$ as the RST signal goes to $V_{dd}$, there is a threshold drop, so $MAX(V_{PD})=V_{dd}-V_{th}$). The photodiode generated charge then discharges the $V_{pd}$ node until it reaches a switch voltage and the process is repeated again.

Figure 3A:
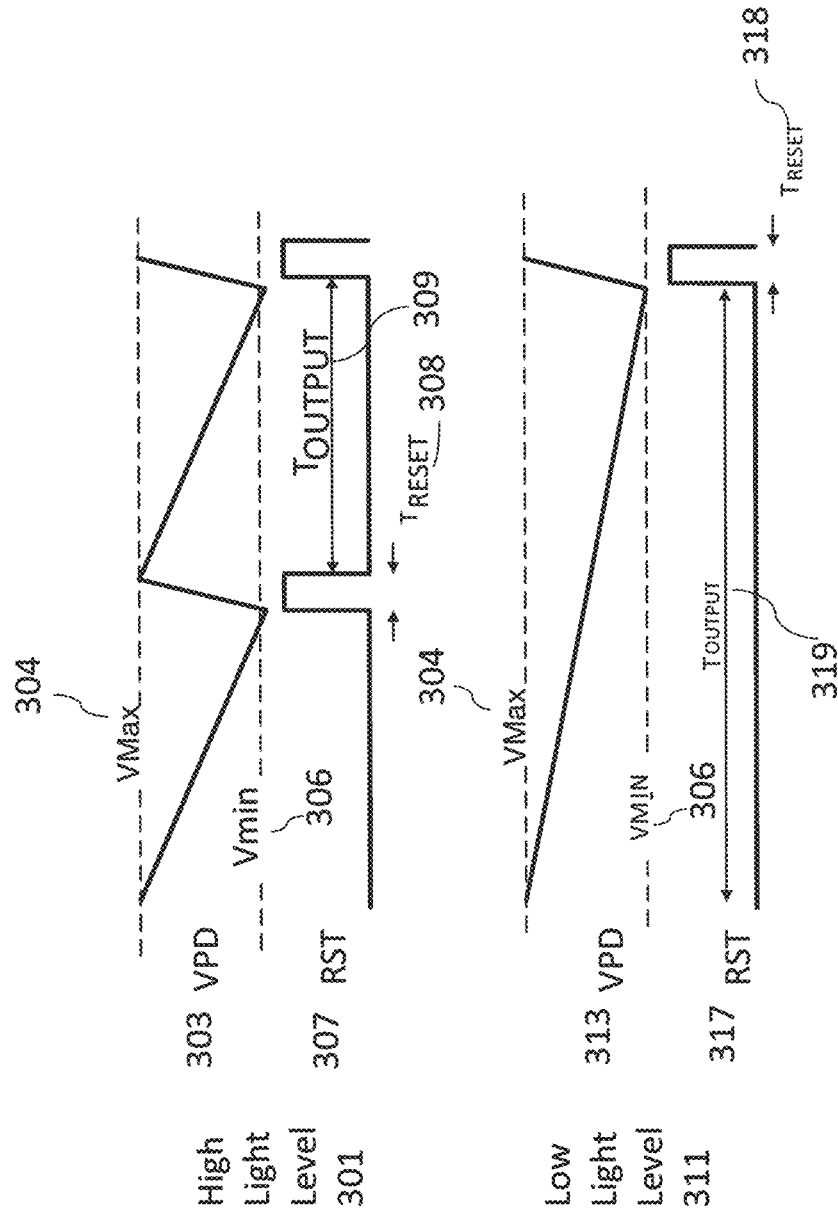

This is shown, for example, in the waveforms shown in FIG. 3a. When the voltage on the cathode of the photodiode $V_{PD}$ 303, 313 falls below a predetermined voltage $V_{MIN}$ 306 the output from the inverter 203 RST 307, 317 rises, causing the NMOS transistor 205 to switch on, which causes the voltage on the photodiode $V_{PD}$ to increase to $V_{MAX}$ 304 and the RST signal will return low, turning off the NMOS transistor 205.

Photons impinging on the reverse-biased photodiode create photo-generated charge and cause a photocurrent to be generated $I_{PD}$. This current causes the voltage $V_{PD}$ to decay until it again reaches the predetermined voltage $V_{MIN}$ when the inverter will again turn on the reset switch.

If a standard CMOS inverter is used, the $V_{MIN}$ voltage is $0.5*V_{DD}$. In some embodiments this voltage can be changed by changing the threshold voltages of either the NMOS or PMOS transistors. Reducing the threshold voltage of the NMOS and/or increasing the threshold voltage of the PMOS causes a reduction in the $V_{MIN}$ voltage and vice-versa. It is preferable to have the lowest practical $V_{MIN}$ voltage as this will slow down the circuit operation and hence reduce the average power consumption.

$V_{MAX}$ is determined by $V_{DD}-V_{TH}$ where $V_{DD}$ is the supply voltage from the photovoltaic cell and $V_{TH}$ 206 is the threshold voltage of the NMOS reset transistor 205. It is preferable to increase the voltage $V_{MAX}$ by reducing the threshold voltage of the NMOS reset transistor 206 where it is supported by the process technology used.

The rate at which the voltage $V_{PD}$ decays is dependent on the photocurrent (which depends on the light level) and the capacitance at that node, which is dominated by CPD 202, the intrinsic capacitance of the photodiode. Applying the equation $$I=C*dV/dt$$

$$I_{PD}=C_{PD}*(V\text{MAX}-V\text{MIN})/T_{OUTPUT}$$

and re-arranging gives $$T_{OUTPUT}=C_{PD}*(V\text{MAX}-V\text{MIN})/I_{PD}.$$

It can be clearly seen that the output period $T_{OUTPUT}$ is inversely proportional to the photocurrent. As described previously, increasing $V_{MAX}$ or decreasing $V_{MIN}$ increases the period of the output pulse, reducing the number of times per second the system is reset and hence reducing the energy consumed.

The high light level 301 example shows a rapid discharge of the $V_{PD}$ voltage 303 by the photodiode current. At the switch point the reset voltage RST 307 (the output of the inverter) pulses, for a time $T_{RESET}$ 308, and which produces a first frequency or output period defined by the $T_{OUTPUT}$ 309 and $T_{RESET}$ 308. The low light level 311 example shows a slower discharge of the $V_{PD}$ voltage 313 by the photodiode current. At the switch point the reset voltage 315 (the output of the inverter) pulses and which produces a second frequency defined by the $T_{OUTPUT}$ 319 and $T_{RESET}$ 318 (which is lower than the high light level 301 example) or output period (which is longer than the high light 301 example).

A circuit such as shown in FIG. 3a when coupled to a simulated 20 pF off-chip load is able to produce an output frequency linear dynamic range between 10 Lux and 10 kLux and furthermore the current consumption against illumination is such that above approximately 10 Lux a 1 mm×1 mm PV cell produces significant current to power the oscillator.

Figure 2B:
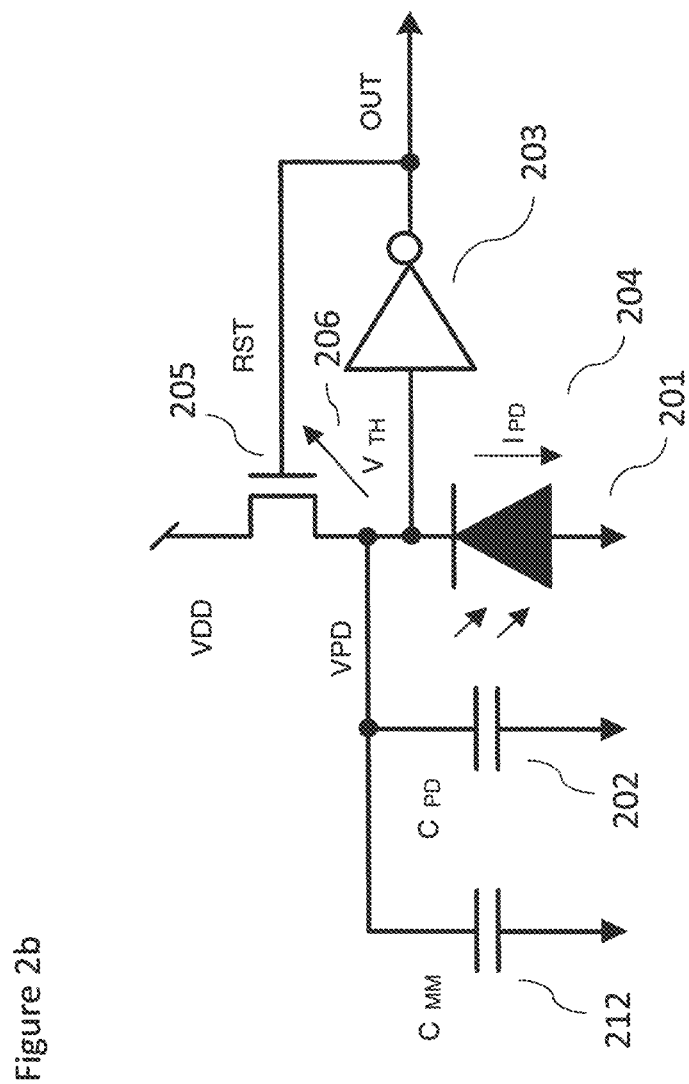
FIG. 2b shows schematically the example ambient light sensor as shown in FIGS. 1a to 1d with shunt metal-metal capacitor.

FIG. 2b shows a further circuit implementation where a further increase in output period (and power reduction) is shown. In this example the capacitance at the photodiode node is increased by adding an extra capacitor in parallel to the photodiode. FIG. 2b shows an example where the extra capacitor is a metal-metal capacitor $C_{MM}$ 212 for better linearity.

Figure 2C:
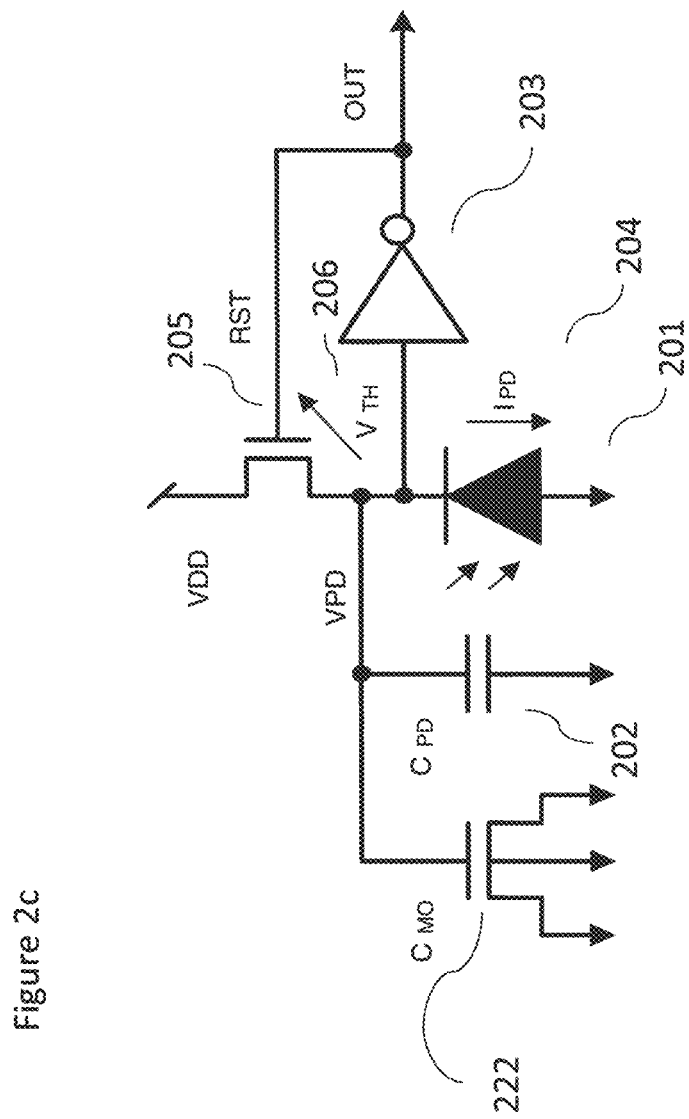
FIG. 2c shows schematically the example ambient light sensor as shown in FIGS. 1a to 1d with shunt MOS capacitor.

FIG. 2C shows a further extra capacitor circuit implementation where a further increase in output period (and power reduction) is produced using a MOS capacitor $C_{MO}$ 222 for better area density.

Figure 2D:
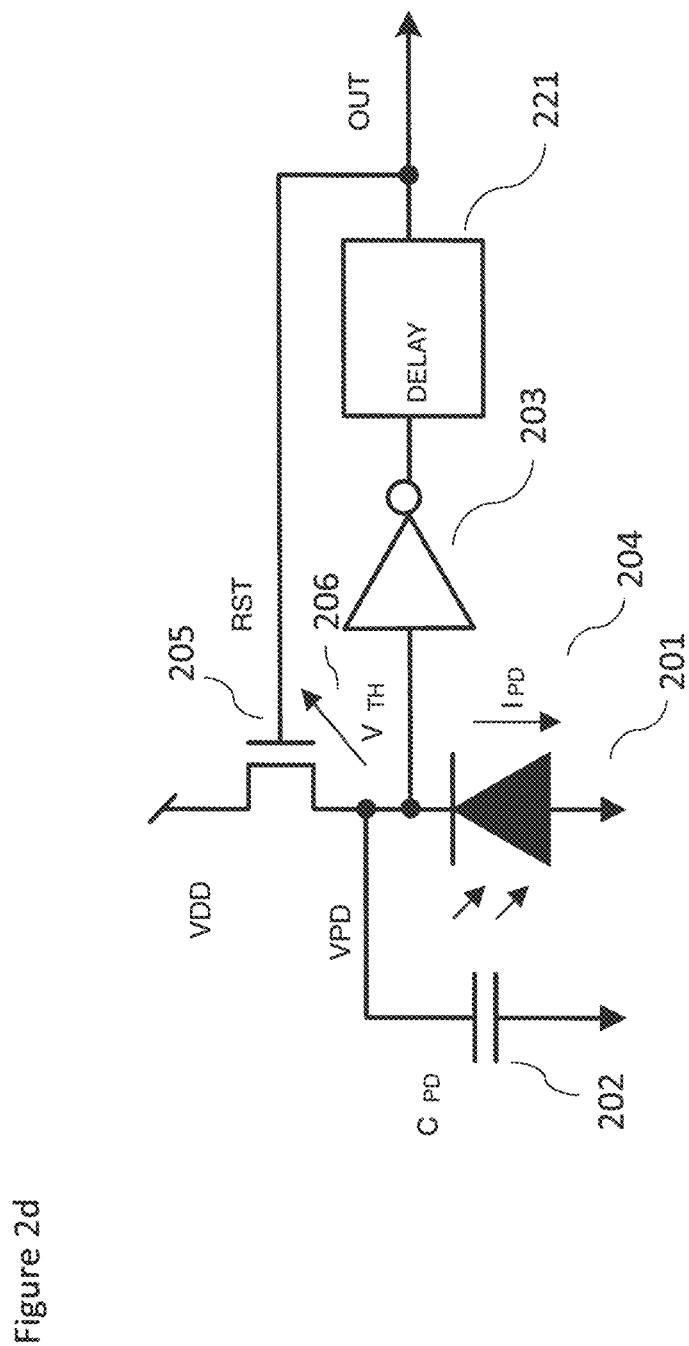
FIG. 2d shows schematically the example ambient light sensor as shown in FIGS. 1a to 1d with reset pulse lengthening using delay cells.

FIG. 2d shows a further circuit implementation. Although the examples shown above use a small number of components, thereby reducing the power consumption, the period of the reset pulse "RST" $T_{RESET}$ may be too short to ensure proper resetting of the photodiode. The reset pulse is activated as soon as the voltage on the photodiode $V_{PD}$ reaches the $V_{MIN}$ threshold, but as soon as the photodiode starts to reset, $V_{PD}>V_{MIN}$ and so the RST voltage starts to fall. A solution to this is to add a delay 221 to the output of the inverter and so lengthen the width of the RST pulse. The delay 221 may be implemented by an even number of inverters such as shown in FIG. 2e by the addition of first delay inverter 243 and second delay inverter 245 following the inverter 203.

Figure 2E:
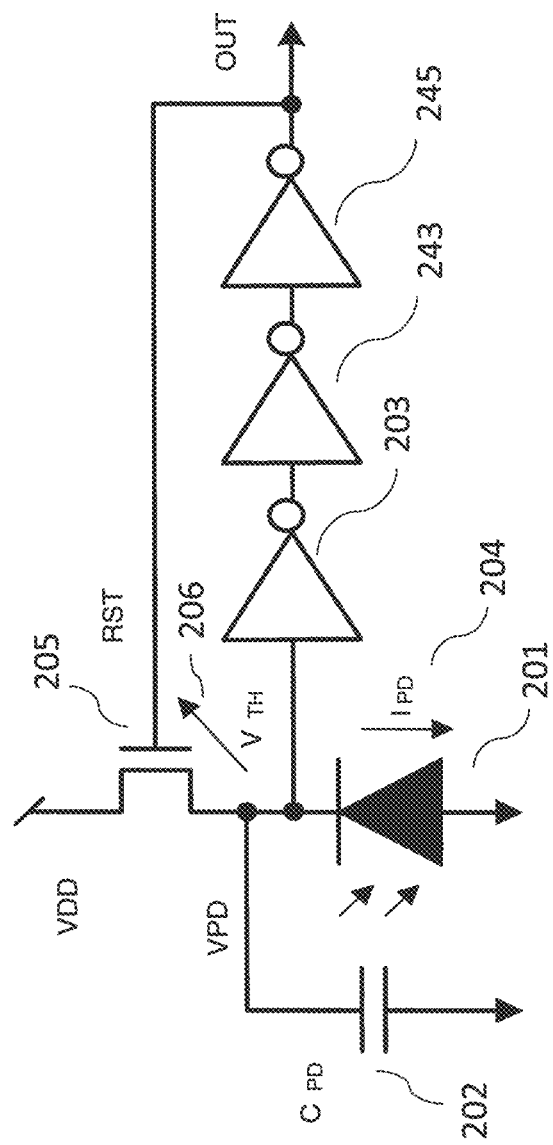
FIG. 2e shows schematically the example ambient light sensor as shown in FIGS. 1a to 1d with reset pulse lengthening using additional inverters.
Figure 3B:
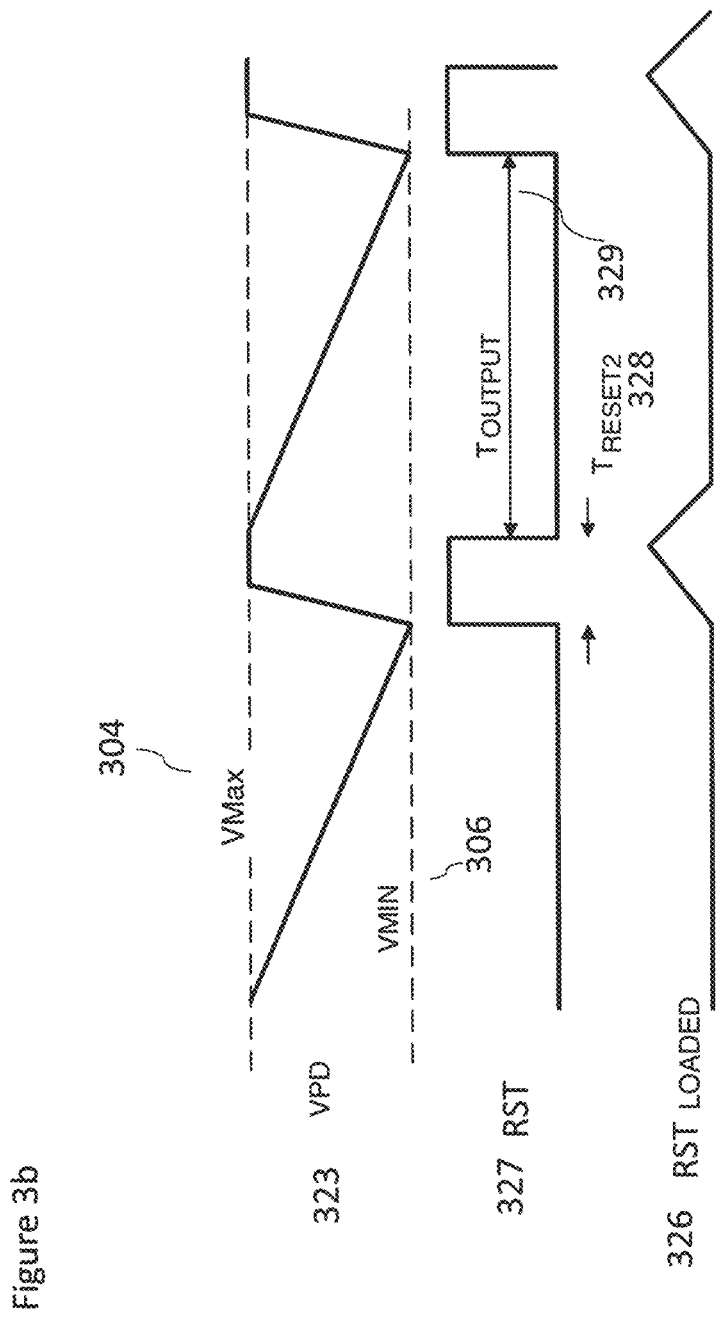
FIG. 3b shows an example pulse lengthened oscillation waveform generated by the ambient light sensor shown in FIGS. 2d and 2e.

The effect of the delay produced by the delay 221 (and the even number of inverters 243, 245) such as shown in FIGS. 2d and 2e are shown in FIG. 3b. As the RST pulse 328 is wider (i.e., $T_{RESET2}>T_{RESET}$), the voltage on the photodiode $V_{PD}$ can reach the $V_{MAX}$ level (and remain there for a short period), ensuring that the photodiode can be fully reset. The oscillation period is then defined by the $T_{OUTPUT}$ 329 and $T_{RESET2}$ 328.

When the ambient light sensor is connected to an external circuit (e.g. the input of a microcontroller), there is load on the RST signal. This load can cause a reduction in the rise-time and fall-time of the signal and where the pulse width is too short there may not be enough time for this slower changing signal to reach the correct voltage level. This may therefore cause the microcontroller to miss the pulse. This is further shown, for example, in FIG. 3b, which shows the $V_{PD}$ 323, RST 327 and $RST_{LOADED}$ 326 signals where the RST$_{LOADED}$ 326 signal does not rise to a level significant to be detected by the output.

Figure 2F:
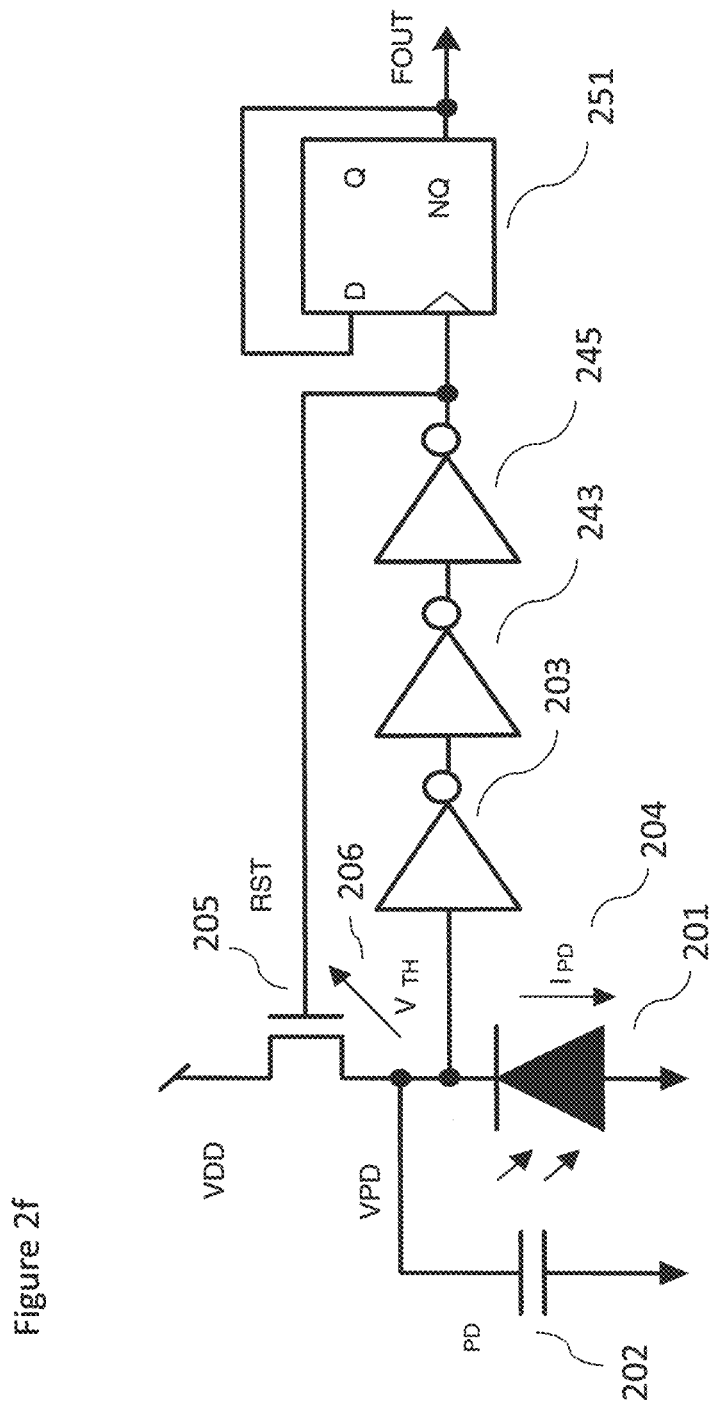
FIG. 2f shows schematically the example ambient light sensor as shown in FIGS. 1a to 1d with reset pulse lengthening using additional inverters and divide by two element.

A solution to this issue is shown in FIG. 2f, which shows the example shown in FIG. 2e with the output of the second delay inverter 245 coupled to a clock input of a D-type flip flop 251. The D-type flip flop is arranged with its inverting output connected to the data input, and thus operates as a divide-by-two circuit. Each RST pulse therefore causes the divide-by-two circuit to change state, i.e., from low to high or vice-versa. FIG. 3c, which shows the signals V$_{PD}$ 323 and RST 327 from FIG. 3b, further shows the inverting output F$_{OUT}$ 336 of the D-type flip flop 251. The width of the F$_{OUT}$ pulse when high T$_{OUTTD2}$ 338 is approximately the same as when F$_{OUT}$ is low (i.e. 1:1 mark-space ratio). Thus there are no short pulses and so this signal is not as susceptible to capacitive loading and reduction of slew-rate of the output as seen in FIG. 3b and shown by F$_{OUT\_LOADED}$ 337. Another advantage with this configuration is that when the ambient light level increases and consequently a higher F$_{OUT}$ frequency is desired to be output, there is concurrently an increase of current produced by the photovoltaic cell (from the increased light level) which is able to provide an increased current drive to the output.

As a significant amount of current produced from the photovoltaic cell is consumed by charging and discharging the load (input capacitance of the microcontroller), the average current consumption is proportional to the load capacitance and frequency of F$_{OUT}$. Although the frequency of F$_{OUT}$ increases at high light levels, the photovoltaic cell is also producing more output current. Thus in some embodiments multiple divide-by-two circuits can be used to reduce the frequency of F$_{OUT}$ and thereby further reduce the average power consumption.

Using careful design of the circuit (e.g. using transistors with long lengths), it is possible to have an average current consumption of approximately 10 nA at lower light levels (e.g., less than 100 Lux) which rises to 100 nA at higher light levels (e.g. 100 kLux). This current consumption of the light to frequency can be produced with a photovoltaic cell of area less than 1 mm$^2$ as is described in further detail hereafter.

As described hereafter where the photovoltaic cell is approximately 10% efficient, then a cell which has an area of 1 mm*1 mm and which has 100 lux of light impinging on the surface will generate around 1 μA of current. Typical external power supply ambient light sensors currently available consume around 1 mA, so the next challenge is to design readout circuitry for the "No Power" ambient light sensor that it will operate at the meagre current levels that are provided by the photovoltaic cells.

This 1 μA current is lower than that consumed by a typical bandgap voltage reference source. A bandgap voltage reference source which outputs a voltage "VBG" which is independent on temperature and process is typically used to control a VCCS (Voltage controlled current source) which provides the reference current for the readout circuitry and by a VCVS (voltage controlled voltage source) which generates the voltage "VREF" which may be used at the non-inverting input of the operational amplifier. A feedback resistor RFB is further typically used in conjunction with the differential input operational amplifier to produce a transimpedance amplifier (TIA). This TIA outputs a voltage which is dependent on the light level $$VOUT = VREF + IPHOTO*RFB$$

Figure 4:
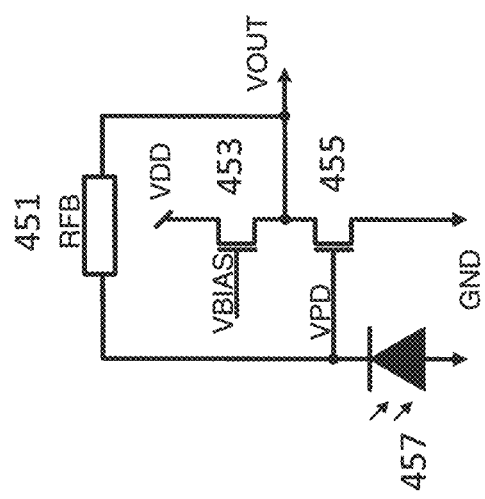
FIG. 4 shows schematically an example ambient light sensor with low consumption light to voltage circuitry.

However, each of these circuit elements are likely to consume more current than is generated by the photovoltaic cells. FIG. 4 thus shows an alternative circuit for readout circuitry. It uses a single transistor 455 to form an inverter. As the single transistor does not require a differential input it does not require the generation of a reference voltage, instead the threshold voltage (V$_{TH}$) of the NMOS transistor sets the DC voltage level V$_{PD}$. The single transistor 455 is furthermore biased by transistor 453 and furthermore the feed-back resistor RFB 451 coupled between the V$_{OUT}$ and the V$_{PD}$ nodes.

$$VOUT = V_{TH} + IPHOTO*RFB$$

Using careful design of the circuitry shown in FIG. 4, by using, for example, transistors with long (≥10 μm length), the current consumed by such a circuit is approximately 100 nA and hence suitable for use with an integrated photovoltaic-photodiode ambient light system (PPALS).

The advantage of using a voltage output, is that the output voltage remains constant (or slowly varying) with time. From the well known equation $$I = C*dV/dt,$$

a constant voltage (i.e., dV/dt=0) does not require any current to charge/discharge the input capacitance of the load (i.e. the ADC input of the microcontroller). Hence, this circuit does not use any of the precious supply current generated by the photovoltaic cell to signal the light level.

As the threshold voltage of a transistor changes with both manufacturing variations and also temperature the output voltage of one part may vary. Thus the sensor may be used in some embodiments to determine relative light measurements. For example, to indicate when the ambient light level in the room is getting lighter or getting darker.

In some embodiments the ALS may be used where the user controls the light level and then indicates that this is their preferred illumination setting. The control system may then use the VOUT from that particular controller as the desired ambient light setting and control the illumination to increase/decrease the light as appropriate. Thus, for example, ambient light in the room impinges on the sensor. The light is used both create power to run the ALS as described herein and is also measured by the readout circuitry which outputs a voltage which is dependent on the ambient light level and possibly also part-part manufacturing variations.

The output "VOUT" from the ALS as described herein may be connected to a microcontroller which has an integrated ADC and so is able to measure the voltage output from the ALS and use it as part of the control loop. The microcontroller may also have control inputs. These, for example, may be IR (infra-red) signals from a remote control (e.g. "Up" or "Down" button presses), or via a wireless protocol (e.g. Bluetooth, low-power Bluetooth or Wi-Fi) or be connected using a wired protocol (SPI, I$_2$C) or other. The user would typically use this control circuitry to command the system to increase (or decrease) the ambient light levels and the microcontroller would change its "LEVEL" output which is connected to the lighting system (Incandescent, Compact fluorescent (CFL), light emitting diodes (LEDs) or other) to produce more (or less) light. LEVEL may be a voltage signal, or a current signal or a digital signal where the pulse width is modulated to cause more (or less) light to be produced by the lighting system or possibly a wireless connection system (such as Bluetooth, low-power Bluetooth or Wi-Fi or proprietary communication system) between the microcontroller and the lighting system.

When the ambient level in the room has increased (or decreased) to a level which the user finds pleasing, the user will then cease sending "Up" (or down) signals to the microcontroller which now causes the "VOUT" signal to be approximately constant (called VOUT_TARGET) and hence the microcontroller "LEVEL" signal will remain approximately constant voltage or current or pulse width and the amount of light produced by the lighting system will remain constant.

Typically as the amount of illumination in a room is a combination of natural (i.e., sunlight) and artificial (i.e., light produced by the lighting system). If the amount of natural light reduces (e.g., the sun sets) then the amount of light on the ALS reduces and the output voltage decreases. The microcontroller would detect that the voltage VOUT is less than VOUT_TARGET and will change the LEVEL signal output from the microcontroller such that more light is produced from the lighting system until VOUT from the ALS returns to the VOUT_TARGET level.

Using such a "closed loop" technique, manufacturing variations of the ALS are not significant as even though the voltage "VOUT" when at the illumination level desired by the user is at a different absolute voltage to a second system, the system will have memorized the voltage from the ALS when the user has set the ambient illumination to be at their preferred setting.

A disadvantage of the light-to-voltage output described in the previous section is that if it is used with a microcontroller, then the microcontroller needs to have an analogue-to-digital converter (ADC) to be able to measure the signal. As well as the ADC increasing the cost of the microcontroller, then a significant amount of energy is required to perform the ADC operation and this can negate the energy saving by using an ALS such as described herein. This can be critical if the microcontroller is battery powered. Hence, a digital output from the ALS can be desirable.

A single photo-illuminated PN silicon junction produces around 0.4V when illuminated. This low voltage may be enough to operate some electronic readout circuitry, but it is too low to generate a digital signal that can be directly detected by common microprocessor/microcontroller devices. A typical low-voltage microcontroller will operate from 1.8V and so the minimum logic-high voltage will be around 50% of this=0.9V, so the output voltage from an ALS as described herein needs to be at least this voltage. Hence, it is necessary to produce a supply voltage of greater than the 0.4V that a single photo-voltaic (PV) junction can supply. The simplest way to achieve this is to connect multiple PV cells. However, if these are implemented on the same substrate, there is a problem isolating each cell from the others.

In some embodiments isolation between the (forward biased) photovoltaic diode and (reverse biased) photodiode can be achieved by using a "triple well" process. The triple well process is one that allows the isolation of a P-Well from the P-Bulk (or N-Well isolation if N-Bulk is used).

Figure 5A:
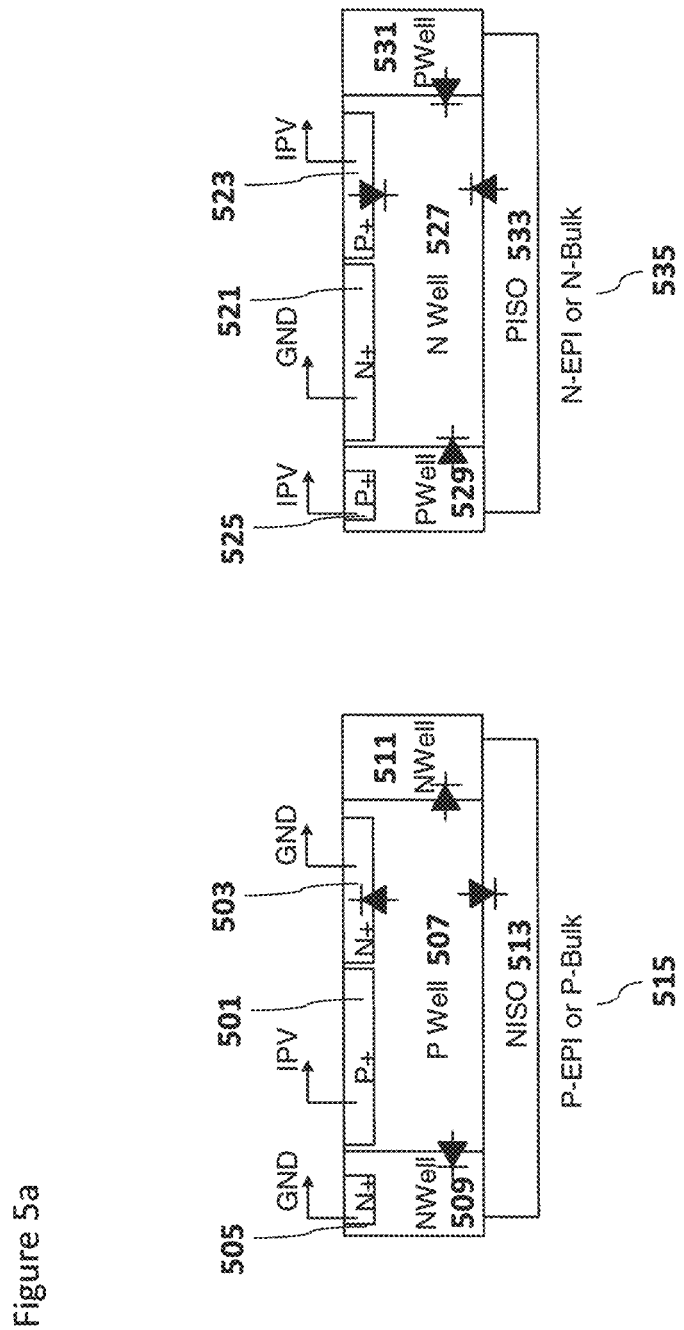
FIG. 5a shows schematically example single PV cell triple well process voltage/power generator configurations according to some embodiments.

Thus, for example, FIG. 5a shows a first PV cell implemented on P-Bulk 515 and also a second PV cell implemented on N-Bulk 535.

The first PV cell implemented within the silicon P-EPI or P-Bulk layer comprises a ring of NWell material (shown in FIG. 5a by NWell 509 and NWell 511) and which is coupled to the ground voltage (and by a N+ doped region 505).

The first PV cell further comprises shows a P+ doped region 501 which couples a PWell region 507 to a first terminal (the first voltage tap IPV) and an N+ doped region 503 (also within PWell region) which may be coupled to the ground terminal (GND). The PWell is further isolated by a NISO layer 513 (Deep NWell) located beneath PWell region.

The alternative PV cell implemented within the silicon N-EPI or N-Bulk layer comprises a ring of PWell material (shown in FIG. 5a by PWell 529 and PWell 531) and which is coupled to the first voltage tap IPV (and by a P+ doped region 525). The alternative PV cell further comprises shows a N+ doped region 521 which couples a NWell region 527 to a ground terminal (GND) and an P+ doped region 523 (also within NWell region) which may be coupled to the voltage tap terminal (IPV). The NWell 527 is further isolated by a PISO layer 533 (Deep PWell) located beneath the NWell.

Figure 5B:
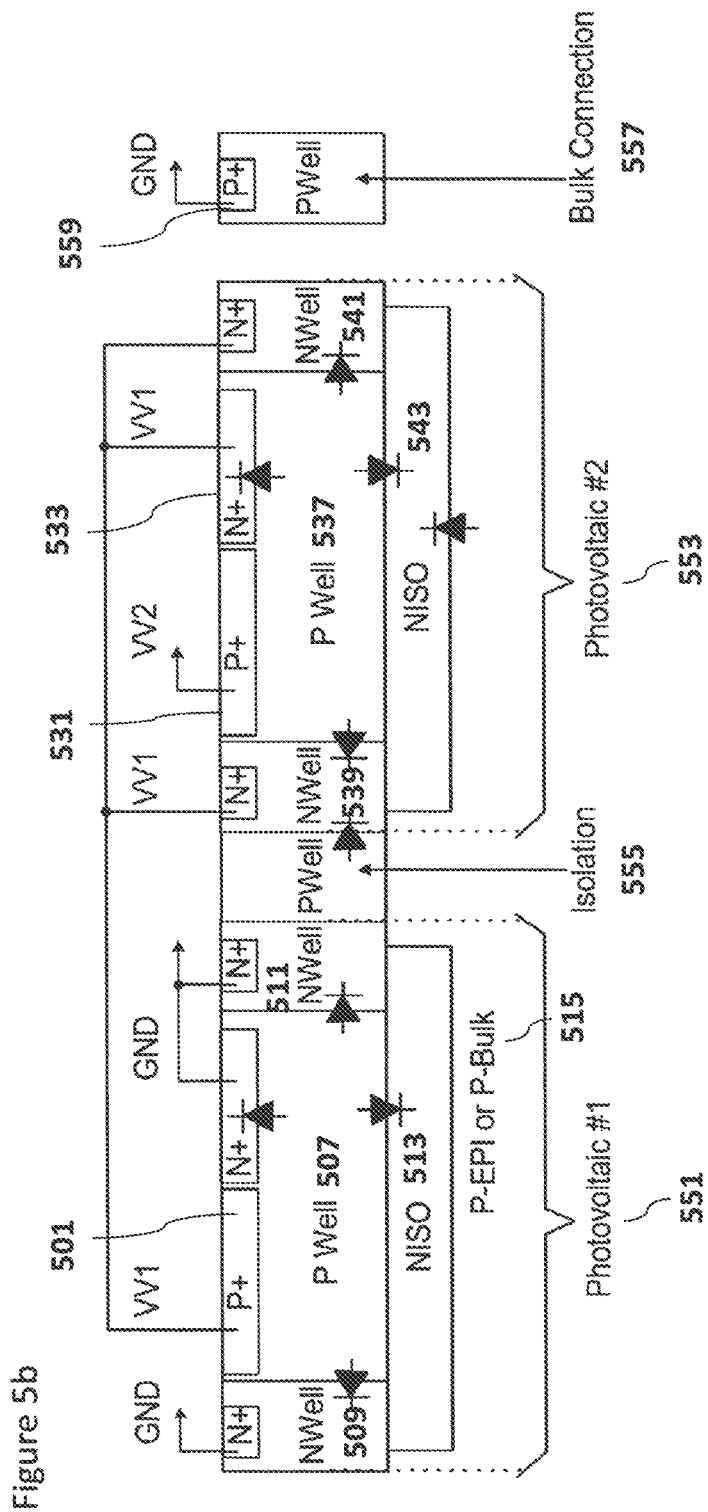
FIG. 5b shows schematically an example two PV cell triple well process voltage/power generator configuration according to some embodiments.

With respect to FIG. 5b, the implementation of two P-Bulk photovoltaic cells are shown connected in series is shown and it can be seen that the voltages are different. Photovoltaic #1 551 comprises N-Well 509, 511 and NISO 513 implants which are at ground on the photovoltaic cell #1 551, but the N-Well 539, 541 and NISO 543 implants are at a higher potential $VV_1$ in photovoltaic cell #2 553 (and coupled to the P+ doped region 501 of photovoltaic cell #1 551. In other words the potential between the NISO and the bulk increases as the number of photocells in series are increased. Photovoltaic #2 553 further comprises P+ doped region 531 coupled to the (even) higher potential $VV_2$. FIG. 5b further shows the PWell isolation region 555 between the PV #1 551 and PV #2 553 and the bilk connection PWell 557 coupled to the ground terminal via a P+ doped region 559.

The problem with the system shown in FIG. 5b is that the leakage current through the isolating diodes, dominated by the photo-generated charge collected by the NISO/P-EPI diode of PV #2 553, is in the opposite direction to the photo-generated charge collected by PV #1 551, cancelling out the photo-generated current.

A solution to this is to reduce the size of the isolation diode and unfortunately, the only way to do this is to make the whole PV cell smaller. Hence, PV #1 (where one terminal is at the common bulk/ground and so doesn't need any isolation) is of area A, the PV #2 cell needs to be of area A/K, PV #3 of area $A/K^2$, PV4 of area $A/K^3$ etc.

It has been found that K is around 2. As such the increase the area of the PV #1 551 diode so that the P-Well/NISO PD of PV #1 551 generates more photocurrent than the NISO/P-EPI diode of PV #2 553 should be around 2:1. If a greater supply voltage is required, then more photo-voltaic cells need to be connected in series and this ratio of areas implemented in successive PV cells. Thus, for example, where 3 PV cells are implemented the area ratio between cells where k=2 is 4:2:1, for 4 PV cells the area ration is 8:4:2:1 and so on. However it has been demonstrated in the lab that the circuit can work with values of K=1.5.

Making the area smaller means that the current output by the whole stack of PV cells is proportional to the smallest diode (e.g. PV4)=$A/K^3$ As discussed previously (with respect to Eqn 1), the photo current from reverse-biased photodiode must be smaller than the current generated from the photovoltaic cells, hence the area of the photodiode should be around 1/10 the area of the smallest photovoltaic cell.

The increased voltage across the NISO—P-Bulk diodes creates a further problem. The process technology used to implement the invention can support only a limited reverse bias voltage before breakdown. However, as the goal is to produce a voltage which is typical of the normal supply voltage (i.e., the voltage that is supplied when a device is operated from an external power supply), this is not a practical limitation.

For example, the typical output voltage from a silicon photovoltaic cell is around 0.6V. For a process where the minimum gate length of a transistor is 90 nm, the supply voltage is typically 1.2V and so only two photovoltaic cells in series would generate 2*0.6V=1.2V, i.e. sufficient voltage to operate the measuring circuitry. For a 180 nm process, the supply voltage would typically be 1.8V and so three photovoltaic cells would be connected in series 3*0.6V=1.8V In some embodiments the isolation between the (forward biased) photovoltaic diode and (reverse biased) photodiode can be achieved by using Deep Trench Isolation (DTI) on top of an insulation layer. This process technology is used by some CMOS image sensor manufacturers to reduce cross-talk in small (≤5 μm) pixels. The DTI is typically formed by anisotropic etching of the silicon to form the trench which is then filled with an insulator material, such as an oxide of silicon such as silicon dioxide or Tetraethyl orthosilicate (TEOS). The insulation layer is typically silicon dioxide.

A first example DTI PV cell 570 is shown by the top left PV cell in FIG. 5*c*. The first DTI example PV cell shows the insulation layer 577 on which are located the DTI isolating material 576 and within which is located the PWell 575 and which may be coupled via a P+ doped region 571 to a voltage terminal (IPV). Furthermore within the PWell 575 is a NWell region 579 which may be coupled via a N+ doped region 573 to the ground terminal.

An alternative example DTI PV cell 580 is shown by the top right PV cell in FIG. 5*c*. The alternative DTI example PV cell shows the insulation layer 587 on which are located the DTI isolating material 586 and within which is located the NWell 585 and which may be coupled via a N+ doped region 581 to a ground terminal (GND). Furthermore within the NWell 585 is a PWell region 589 which may be coupled via a P+ doped region 583 to the voltage terminal (IPV).

In these examples the process technology used supports the manufacture of vertical diodes (either NWell inside PWell or PWell inside NWell).

A further alternative example DTI PV cell 590 is shown by the lower PV cell in FIG. 5*c*. The further alternative DTI example shows an implementation of a photovoltaic cell using DTI but where the process technology used does not support the manufacture of vertical diodes. As such the PV cell shows the insulation layer 597 on which are located the DTI isolating material 596 and within which is located the NWell 599 and which may be coupled via a N+ doped region 593 to a ground terminal (GND). Furthermore adjacent the NWell 585 and extending down to the insulation layer 597 is a PWell region 595 which may be coupled via a P+ doped region 591 to the voltage terminal (IPV).

The further alternative example DTI PV cell 590 further shows a photo-generated carrier being generated away from the PN junction, near the DTI. For this to be collected, this carrier needs to diffuse towards the PN junction. If the photovoltaic cell is large (e.g. WIDTHP1≥10 μm or WIDTH1≥10 μm), then this carrier may recombine with the silicon and be lost from collection. The solution to this recombination is to implement more, smaller wells as shown in FIG. 5*d*.

Figure 5D:
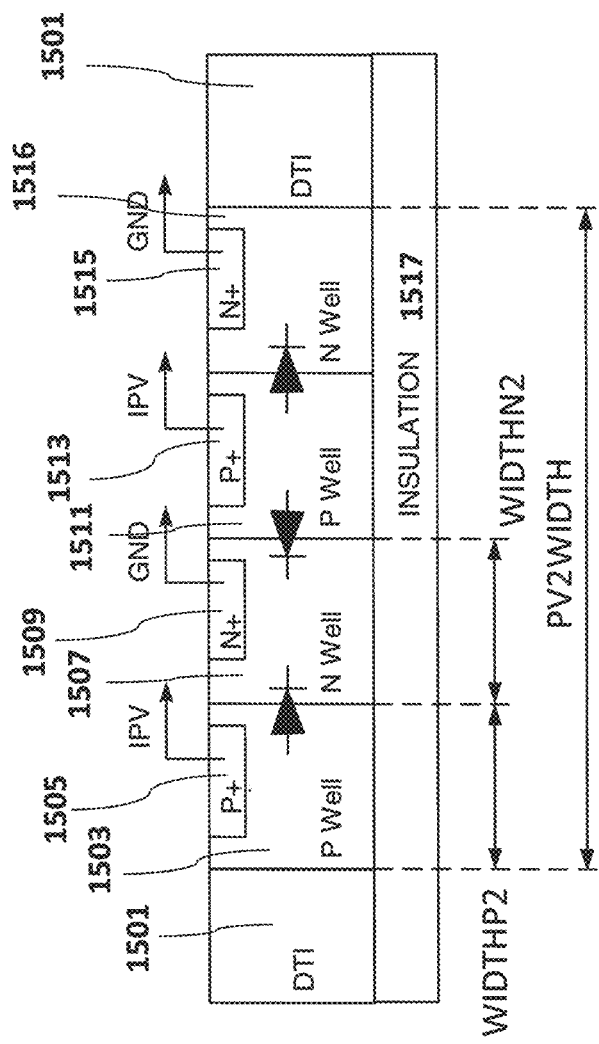
FIG. 5d shows schematically an example PV cell multiple junction deep well isolation process voltage/power generator configuration according to some embodiments.

FIG. 5*d* shows a further example DTI PV cell. As such the PV cell shows the insulation layer 1517 on which are located the DTI isolating material 1501 and within which is located alternating full depth NWell regions 1507, 1516 (and which may be coupled via N+ doped regions 1509, 1517 to a ground terminal (GND)) and full depth PWell regions 1503, 1511 (which may be coupled via P+ doped regions 1505, 1513 to the voltage terminal (IPV)).

For example, if the size of the PV cell PV2WIDTH is 100 μm, and the diffusion length of carriers is 10 μm then WIDTHP2 would be ≤20 μm and similarly, WIDTHN2≤20 μm to ensure that no photo-generated carrier is further than 10 μm a PN junction.

Where there is a vertical junction, as in the case of the first two example DTI PV cell diodes, then the size of the wells is less critical as photo-generated charge can diffuse to the vertical junction and be collected.

Figure 5E:
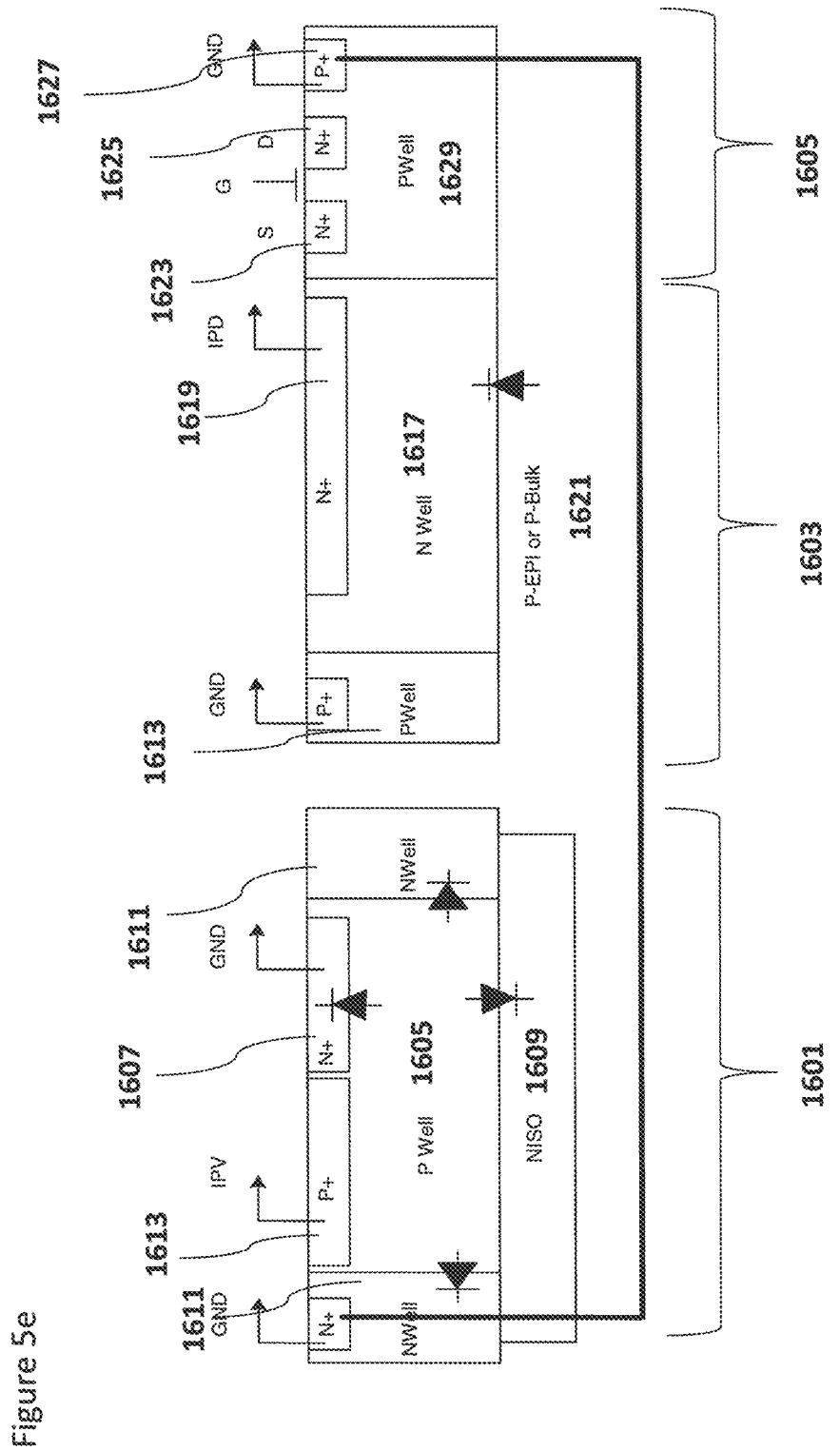
FIG. 5e shows schematically a PV cell, PD and NMOS transistor integration with P-bulk configuration according to some embodiments.

With respect to FIG. 5*e* the integration of the PV cells such as shown in FIGS. 5*a* to 5*d* and the other electronic components of the ambient light sensor is shown.

FIG. 5*e* this shows an example PV cell 1601 which comprises NWell 1611 and NISO 1609 isolation regions within which is the PWell 1605 region and the P+ doped region 1613 coupled to IPV and N+ doped region 1607 coupled to GND. Further implemented on the P-EPI or P-Bulk 1621 is the Photodiode 1603 comprising the PWell 1613 coupled (via P+ doped region) to GND and NWell 1617 coupled (via N+ doped region) to IPD.

In such implementations the terminal IPV is now isolated from both the ground (GND) and terminal IPD by the reverse biased diodes. The P-N junction NISO 1609 to P-EPI (or P-BULK) is at 0V as typically the GND of the PV cell will be connected to the GND of the circuitry elsewhere}.

FIG. 5*e* furthermore shows a NMOS transistor 1605 implemented within a PWell region 1629 (implemented by n+ doped regions 1625 and 1623 and a gate) and has a conduction path through the P-bulk 1621 to the PWell 1605 of the photovoltaic cell 1601. For ease of drawing, a PMOS transistor is not shown as it would be in an N-Well which isolates it from the P-Bulk.

Figure 5F:
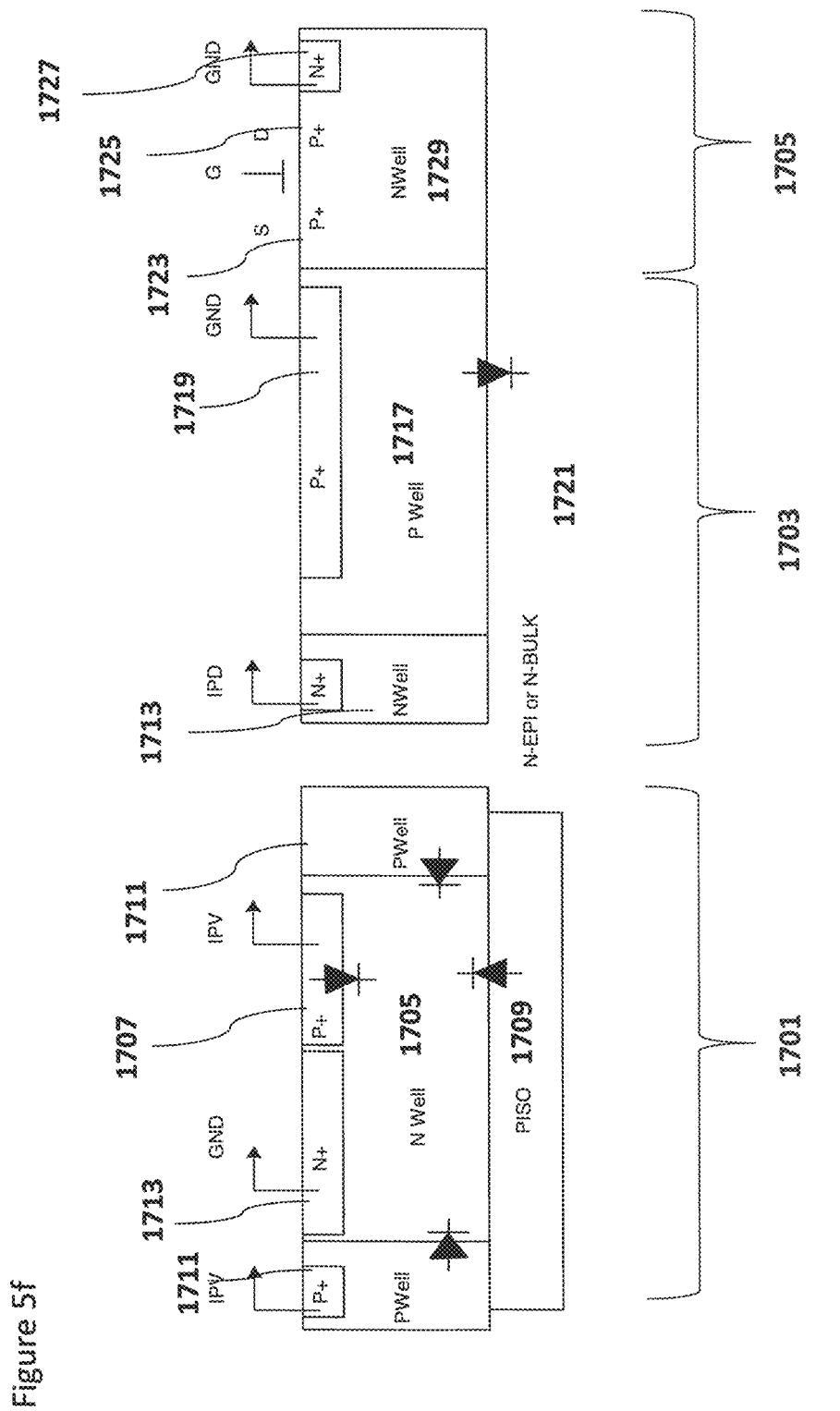
FIG. 5f shows schematically a PV cell, PD and PMOS transistor integration with N-bulk configuration according to some embodiments.

FIG. 5*f* shows an integrated implementation using N-Bulk technology. PV cell 1601 which comprises PWell 1711 and PISO 1709 isolation regions within which is the NWell 1705 region and the N+ doped region 1713 coupled to GND and P+ doped region 1707 coupled to IPV. Further implemented on the N-EPI or N-Bulk 1721 is the Photodiode 1703 comprising the NWell 1713 coupled (via N+ doped region) to IPD and PWell 1717 coupled (via P+ doped region 1719) to GND.

FIG. 5*f* furthermore shows a PMOS transistor 1705 implemented within a NWell region 1729 (implemented by p+ doped regions 1725 and 1723 and a gate) however the photodiode current collected at IPD will include photo-generated charge from a large area in the bulk.

Figure 6A:
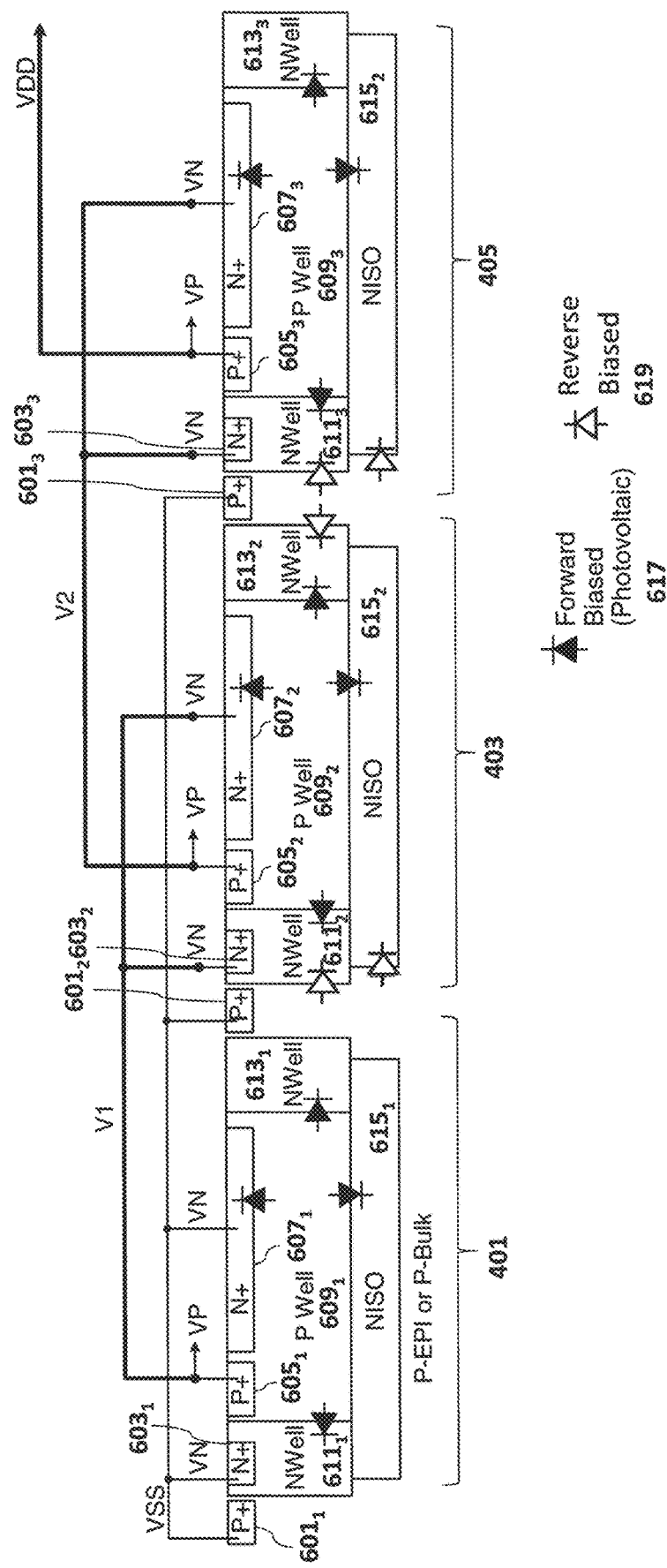
FIGS. 6a and 6b show schematically in further detail a first voltage/power generator configuration according to some embodiments.

With respect to FIG. 6*a* a cross-section example implementation with multiple PV cells using the triple well technology shown previously. These may be implemented, for example, within the silicon using imaging layers. The PV cells 401, 403 and 405 are implemented within the silicon P-EPI or P-Bulk layer. The silicon P-EPI or P-Bulk layer is coupled to the ground voltage by a P+ doped region $601_1$ located neighboring the first PV cell 401 (and optional further P+ doped region $601_2$ located neighboring the second PV cell 403, and a P+ doped region $601_3$ located neighboring the third PV cell 405). The extra P+ are optional. Furthermore the P+ region may be located anywhere on the die but have been shown close to each PV cell for ease of explanation.

The first PV cell 401 shows a P+ doped region $605_1$ which couples a PWell region $609_1$ to a first terminal (the first voltage tap $V_1$) and an N+ doped region $607_1$ (also within the PWell region) which is coupled to the ground terminal (the ground voltage $V_{ss}$). The PWell region is also surrounded laterally by a NWell ring (shown in FIG. 6a as two NWell regions $611_1$ and $613_1$) connected via a N+ doped region $603_1$ to the ground terminal (and ground voltage $V_{ss}$). Beneath the PWell region is the NISO (or Deep NWell) layer $615_1$.

The second PV cell 403 shows a P+ doped region $605_2$ which couples a PWell region $609_2$ to a second terminal (the second voltage tap $V_2$) and an N+ doped region $607_2$ (also within the PWell region) which is coupled to the first terminal (the first voltage tap $V_1$). The PWell region $609_2$ is also surrounded by a NWell ring (shown in FIG. 6a by two NWell regions $611_2$ and $613_2$) connected via a N+ doped region $603_2$ to the first terminal (and first voltage tap $V_1$). Beneath the PWell is the NISO (or Deep NWell) layer $615_2$.

The third PV cell 405 shows a P+ doped region $605_3$ which couples a PWell region $609_3$ to a third terminal (the third voltage tap $V_{dd}$) and an N+ doped region $607_3$ (also within the PWell region) which is coupled to the second terminal (the second voltage tap $V_2$). The PWell region $609_3$ is also surrounded by a NWell ring (shown in FIG. 6a by two NWell regions $611_3$ and $613_3$) connected via a N+ doped region $603_3$ to the second terminal (and first voltage tap $V_2$). Beneath the PWell region is the NISO (or Deep NWell) layer $615_3$.

FIG. 6a furthermore shows the expected forward biased (PV) diode junctions between the PWell region 609 and the NWell 611 613, N+ doped 607 and NISO regions 615. Also shown in FIG. 6a are the reverse biased diode junctions between the P-EPI or P-Bulk and the second and third PV cell NWell and NISO regions.

Figure 6B:
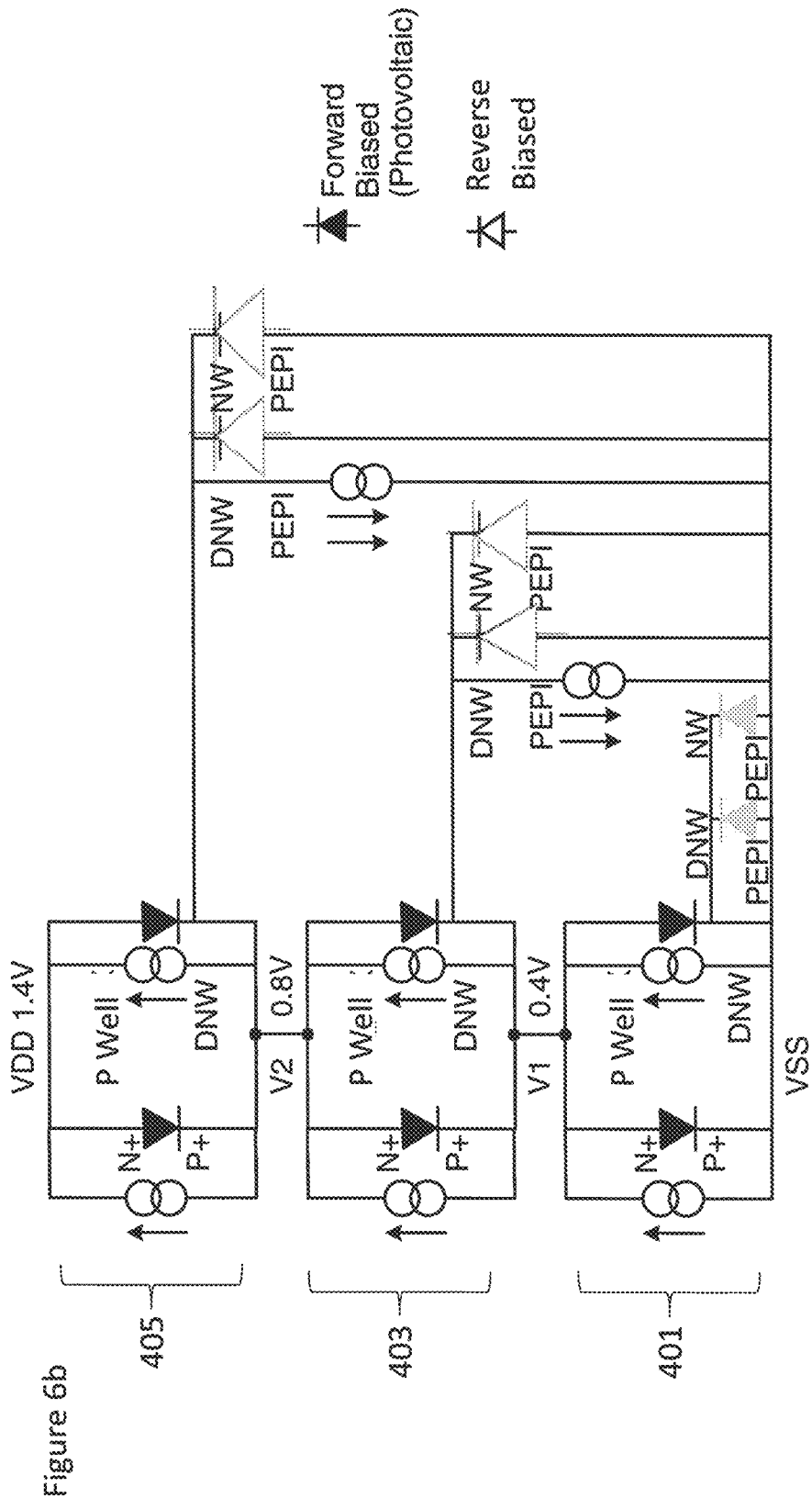

With respect to FIG. 6b, an example current model of the PV cells shown in FIG. 6a with the forward and reverse biased diode junctions is shown.

It has been found that where the PV cells are not completely isolated, for example, if the deep N-Well isolation does not completely isolate each PV cell from each other, then the isolation diodes of the second PV cell 403 (in other words forwards biased junction from the P-EPI or P-Bulk layer to the N Well region and the NISO region) overwhelm the collection diodes of the first PV cell 401 resulting in the PV cells not producing a summed voltage.

The operating voltage of the readout circuitry will depend on the process technology used for fabrication. Typical voltages are 3.3V, 2.8V, 1.8V and 1.2V for more advanced process technologies. As can be seen in the circuit diagrams, PV can be modelled as forward biased diodes and so the output voltage is limited by the diode as higher voltages will cause the diode to conduct and consume the photo-generated current. If the diodes are manufactured in silicon, then typical forward voltages of the diode are in the range of 0.5V-0.7V.

Figure 7:
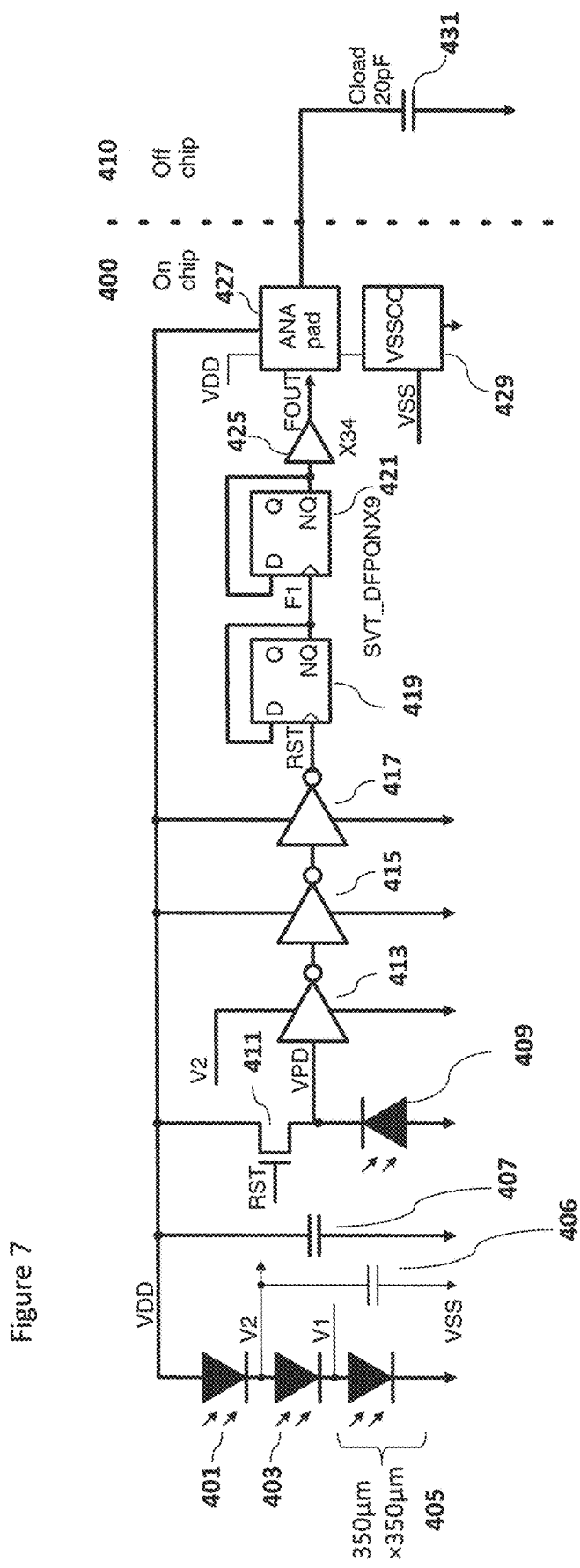
FIG. 7 shows schematically an example ambient light sensor with voltage/power generator according to some embodiments.

An example schematic view of a light sensor according to some embodiments is shown in FIG. 7. FIG. 7 shows the off-chip 410 simulated load $C_{load}$ 431 of 20 pF. The on-chip 400 components comprise the generator comprising three series linked PV cells which in this example are 350×350 μm. The first PV cell 405 is coupled between the Vss (ground) terminal and the first voltage tap $V_1$. The second PV cell 403 is coupled between the first voltage tap $V_1$ and the second voltage tap $V_2$. The third PV cell 401 is coupled between the second voltage tap $V_2$ and the third voltage tap $V_{DD}$. The second voltage tap $V_2$ is furthermore coupled to the ground Vss terminal via a second voltage tap smoothing capacitor 406. The third voltage tap $V_{DD}$ is furthermore coupled to the ground Vss terminal via a third voltage smoothing capacitor 407. In some embodiments more PV cells can be added where a higher voltage is required. For example, the on-chip logic cells operate from a higher voltage or if the off-chip device requires a higher voltage swing. The reset transistor 411 is coupled with a reset input to the gate, and is coupled between the third voltage tap $V_{dd}$ and the photodiode 409. As the reset operation requires current to charge the photodiode and this current is photo-generated, the area of photodiode should be much less than the photovoltaic area. For example, in some embodiments a 50:1 ratio in area may be used. In some embodiments an area ratio of 10:1 may be implemented. Furthermore ratios of 100:1 may also be used in some embodiments.

The photodiode 409 is coupled between the reset transistor 411 and the ground terminal $V_{ss}$ and is configured to discharge the stored charge and generate a photodiode voltage $V_{pd}$ which is input to a first inverter 413. The first inverter 413 is configured to receive the photodiode voltage from the photodiode 409. The first inverter 413 (and the other inverters) are configured to operate as comparators. In some embodiments the first inverter may optionally be powered by the second (or lower than $V_{dd}$) voltage tap $V_2$ rather than the third (or $V_{dd}$) voltage tap the 'comparator' threshold is lower which results in a larger voltage swing on the photodiode, thereby reducing the system noise and increasing the dynamic range. The output of the first inverter 413 may as discussed previously be coupled to further pairs of inverters. For example as shown in FIG. 7 the output of the first inverter 413 is coupled to an input of a second inverter 415, the second inverter being powered by the third voltage tap $V_{dd}$. The output of the second inverter 415 is coupled to an input of a third inverter 417, the third inverter being powered by the third voltage tap $V_{dd}$. The output of the third inverter is the reset signal which is passed back to the reset transistor 411 as the gate input in order to enable the oscillator to reset. In some embodiments more than a single pair of inverters may be used to delay the signal. For example, four pairs (8 inverters) may be used to slow down the output RST signal to ensure that the photodiode 409 is completely reset. This is as discussed previously is because as soon as it starts to reset (voltage VPD rises) the comparator 413 goes low and if the reset is stopped then, the photodiode is only slightly above the comparator switching threshold voltage. Furthermore the reset signal then input as a clock input to a first latch 419. The negative output of the first latch 419 is then input as the data input and furthermore as the clock input to a second latch 421. The negative output of the second 421 is then input to a buffer 435.

The latches are used to divide the frequency output. Thus, for example, by using two latches the frequency is divided by $2^2$ or 4. Other divisions are possible in other embodiments by increasing or decreasing the number of latches. As discussed above the more flip-flops or latches used the more the output signal frequency is decreased, so reducing the overall system power consumption. This reduction of power consumption could be useful to extend the system operation into lower light levels.

The output of the buffer is the frequency signal output and may be passed to a device or packaging pad ANA pad 427 which is powered by the third voltage tap $V_{dd}$ and the VSSCO 429 which supplies the ground $V_{ss}$ voltage.

Figure 8:
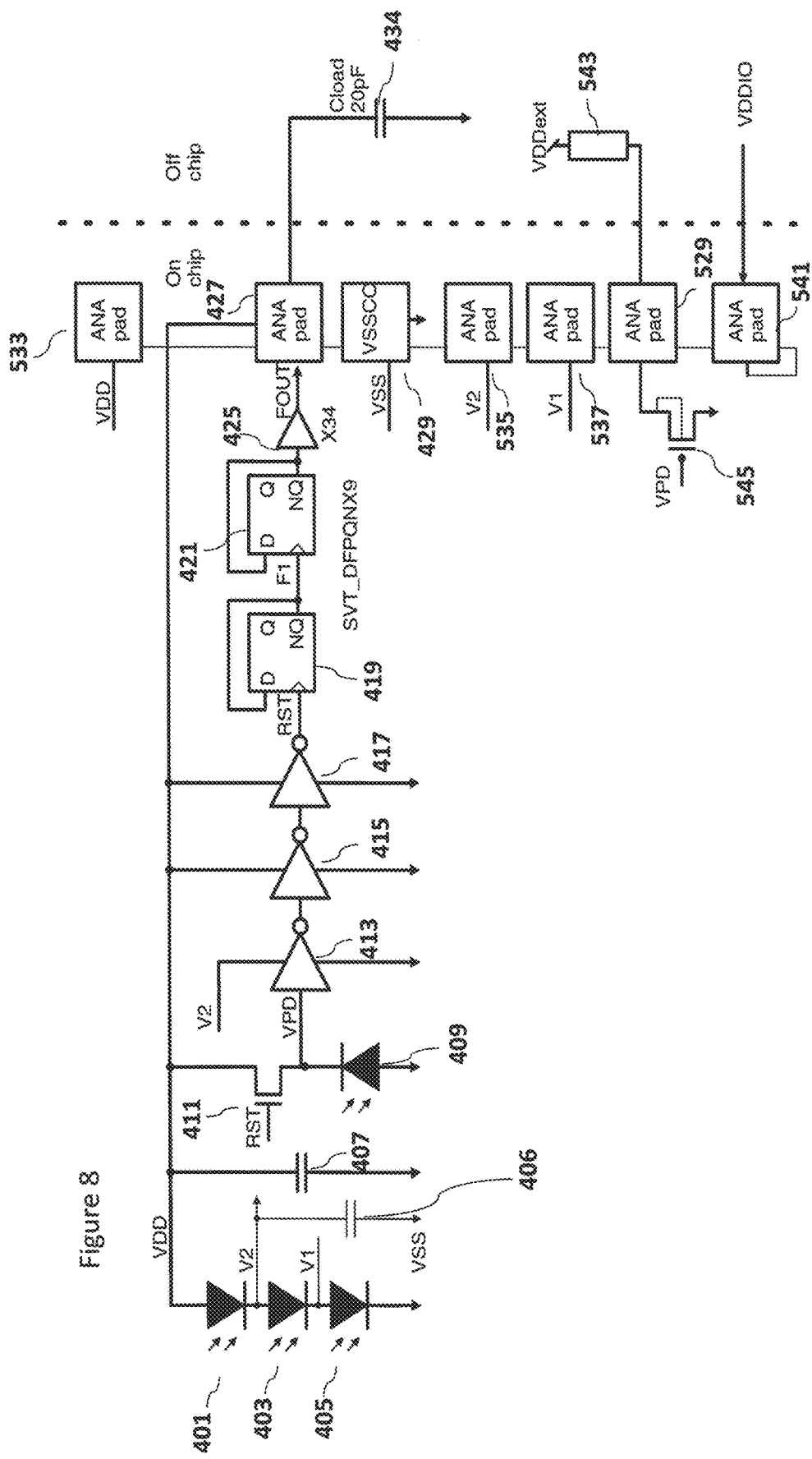
FIG. 8 shows schematically a further example ambient light sensor with voltage/power generator according to some embodiments.

An example schematic view of a further light sensor according to some embodiments is shown in FIG. 8. FIG. 8 shows a sensor similar to that shown in FIG. 7 but where the PV connections are brought off-chip for characterization. The off-chip 510 simulated load $C_{load}$ 431 of 20 pF. The on-chip 400 components comprise the generator comprising three series linked PV cells which in this example are 350×350 mm. The first PV cell 405 is coupled between the Vss (ground) terminal and the first voltage tap $V_1$. The second PV cell 403 is coupled between the first voltage tap $V_1$ and the second voltage tap $V_2$. The third PV cell 401 is coupled between the second voltage tap $V_2$ and the third voltage tap $V_{DD}$. The second voltage tap $V_2$ is furthermore coupled to the ground Vss terminal via a second voltage tap smoothing capacitor 406. The third voltage tap $V_{DD}$ is furthermore coupled to the ground Vss terminal via a third voltage smoothing capacitor 407. The reset transistor 411 is coupled with a reset input to the gate, and is coupled between the third voltage tap $V_{DD}$ and the photodiode 409.

The photodiode 409 is coupled between the reset transistor 411 and the ground terminal $V_{ss}$ and is configured to discharge the stored charge and generate a photodiode voltage $V_{pd}$ which is input to a first inverter 413. The first inverter 413 is configured to receive the photodiode voltage from the photodiode 409. The first inverter 413 (and the other inverters) are configured to operate as comparators and by powering the first inverter by the second voltage tap $V_2$ rather than the third voltage tap the 'comparator' threshold is lower. The output of the first inverter 413 is coupled to an input of a second inverter 415, the second inverter being powered by the third voltage tap $V_{DD}$. The output of the second inverter 415 is coupled to an input of a third inverter 417, the third inverter being powered by the third voltage tap $V_{DD}$. The output of the third inverter is the reset signal which is passed back to the reset transistor 411 as the gate input in order to enable the oscillator to reset. Furthermore the reset signal then input as a clock input to a first latch 419. The negative output of the first latch 419 is then input as the data input and furthermore as the clock input to a second latch 421. The negative output of the second 421 is then input to a buffer 435.

The latches are used to divide the frequency output. Thus, for example, by using two latches the frequency is divided by $2^2$ or 4. Other divisions are possible in other embodiments by increasing or decreasing the number of latches.

The output of the buffer is the frequency signal output and may be passed to a first device or packaging pad ANA pad 427 which is powered by the third voltage tap $V_{DD}$ and the VSSCO 429 which supplies the ground $V_{ss}$ voltage. The ANA pad are for analogue signals and do not have any current consuming buffers, but they do have ESD protection circuitry. Furthermore there is shown a further set of device or packaging pads (ANA pads). These are a second voltage tap $V_2$ pad 535 which receives the second voltage tap $V_2$ to output off-chip, a first voltage tap $V_1$ pad 537 which receives the first voltage tap $V_1$ to output off-chip, a third voltage tap $V_{DD}$ pad 529 which receives an external $V_{DDext}$ voltage (for debugging) and which is coupled on-chip to a transistor 545 which receives the third voltage tap $V_{pd}$ as the gate input. In some embodiments there is a further pad 541 which is configured to drive a Vddio using in the pad ring only for debugging.

In such a manner it is possible to fit within a 1×1 mm package the three PV cells (each 350×350 μm), the photodiode (50×50 μm) and readout circuitry (20×20 μm) as well as decoupling capacitance parts and signal output and ground pads for providing the signal output.

Although in the examples shown herein show three PV cells in series configuration any suitable number of PV cells may be used. For example, a single PV cell may be used, or two or more PV cells in series may be employed.

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. An integrated circuit comprising:
   a semiconductor substrate;
   a photo-voltaic cell implemented on the semiconductor substrate, the photo-voltaic cell configured to generate a supply voltage; and
   active circuitry comprising an inverter and a photodiode implemented on the semiconductor substrate, the active circuitry powered by the supply voltage, wherein the integrated circuit comprises a plurality of photo-voltaic cells coupled in series, the photo-voltaic cell being one of the plurality of photo-voltaic cells, wherein the plurality of photo-voltaic cells is configured to generate a further supply voltage that is less than the supply voltage, and wherein the inverter is powered by the further supply voltage.

2. The integrated circuit as claimed in claim 1, wherein the photo-voltaic cell is isolated from the semiconductor substrate.

3. The integrated circuit as claimed in claim 2, wherein the photo-voltaic cell is implemented within a deep trench isolation ring on an insulation layer implemented on the semiconductor substrate.

4. The integrated circuit as claimed in claim 2, wherein the photo-voltaic cell is isolated from the semiconductor substrate by implementing an N well cell within a P well ring and over a deep P well implemented on an N-EPI or N-bulk substrate.

5. The integrated circuit as claimed in claim 2, wherein the photo-voltaic cell is isolated from the semiconductor substrate by implementing a P well cell within an N well ring and over a deep N well implemented on a P-EPI or P-bulk substrate.

6. The integrated circuit as claimed in claim 1, further comprising a supply voltage smoothing capacitor coupled between the supply voltage and a ground voltage.

7. The integrated circuit as claimed in claim 1, wherein the active circuitry comprises an ambient light sensor;
   wherein the ambient light sensor comprises the photodiode coupled to the supply voltage via a switch that is configured to reset the photodiode and is controlled by a photodiode output;
   wherein an inverter input coupled to the photodiode output and an inverter output coupled to the switch to control the reset of the photodiode; and
   wherein the integrated circuit comprises the plurality of photo-voltaic cells coupled in series, the photo-voltaic cell being one of the plurality of photo-voltaic cells; and
   wherein the plurality of photo-voltaic cells coupled in series is configured to generate the supply voltage.

8. The integrated circuit as claimed in claim 1, wherein the active circuitry comprises:

a single transistor having a control node coupled to the photodiode;

a bias transistor coupled between the supply voltage and the single transistor through a output node; and a feed-back resistor coupled between the output node and the control node.

9. The integrated circuit as claimed in claim 1, wherein the integrated circuit uses no external power to power the active circuitry.

10. An integrated circuit comprising:

a semiconductor substrate;

a photo-voltaic cell implemented on the semiconductor substrate, the photo-voltaic cell configured to generate a supply voltage; and an ambient light sensor implemented on the semiconductor substrate, the ambient light sensor powered by the supply voltage, wherein the ambient light sensor comprises a light to frequency oscillator comprising a photodiode coupled to the supply voltage via a switch, the switch configured to reset the photodiode and controlled by a photodiode output; and a flip flop implemented on the semiconductor substrate, the flip flop comprising a clock input coupled to the output of the light to frequency oscillator, wherein the flip flop comprises a data input coupled to an inverted output of the flip flop.

11. The integrated circuit as claimed in claim 10, wherein the ambient light sensor further comprises an inverter, wherein an inverter input is coupled to the photodiode output and an inverter output is coupled to the switch to control the reset of the photodiode.

12. The integrated circuit as claimed in claim 11, wherein the integrated circuit comprises a plurality of photo-voltaic cells coupled in series, the photo-voltaic cell being one of the plurality of photo-voltaic cells, and wherein the plurality of photo-voltaic cells is configured to generate the supply voltage and is further configured to generate a further supply voltage that is less than the supply voltage.

13. The integrated circuit as claimed in claim 12, wherein the inverter is powered by the further supply voltage.

14. The integrated circuit as claimed in claim 12, further comprising a further supply voltage smoothing capacitor coupled between the further supply voltage and a ground voltage.

15. The integrated circuit as claimed in claim 11, further comprising a frequency divider coupled to an output of the inverter, wherein the frequency divider is formed with the flip flop.

16. The integrated circuit as claimed in claim 11, wherein the inverter comprises an odd number of inverters connected in series and wherein an input for a first inverter of the odd number of inverters is coupled to the photodiode output and an output for a last inverter of the odd number of inverters is coupled to the switch to control the reset of the photodiode.

17. An integrated circuit comprising:

a semiconductor substrate;

a plurality of photo-voltaic cells coupled in series implemented on the semiconductor substrate, the plurality of photo-voltaic cells configured to generate a supply voltage; and active circuitry implemented on the semiconductor substrate, the active circuitry powered by the supply voltage, wherein the active circuitry implemented on the substrate is an ambient light sensor comprising a photodiode coupled to the supply voltage by a switch and an inverter with an inverter input coupled to an output of the photodiode and an inverter output coupled to the switch, and wherein the plurality of photo-voltaic cells is further configured to generate a further supply voltage that is less than the supply voltage, wherein the inverter is powered by the further supply voltage.

18. The integrated circuit as claimed in claim 17, wherein the plurality of photo-voltaic cells is further configured to generate a further supply voltage that is less than the supply voltage.

19. An integrated circuit comprising:

a semiconductor substrate;

a plurality of photo-voltaic cells coupled in series implemented on the semiconductor substrate, the plurality of photo-voltaic cells configured to generate a supply voltage; and active circuitry implemented on the semiconductor substrate, the active circuitry powered by the supply voltage, wherein an area ratio of the plurality of photo-voltaic cells is $1:1/k^n$, where k is an area ratio factor substantially between 1.1 to 2, and n is a number of the photo-voltaic cells in the plurality of photo-voltaic cells.

* * * * *